(12) United States Patent
Schwartz et al.

(10) Patent No.: US 11,584,863 B2
(45) Date of Patent: *Feb. 21, 2023

(54) CURABLE HIGH REFRACTIVE INDEX INK COMPOSITIONS AND ARTICLES PREPARED FROM THE INK COMPOSITIONS

(71) Applicant: 3M INNOVATIVE PROPERTIES COMPANY, St. Paul, MN (US)

(72) Inventors: Evan L. Schwartz, Vadnais Heights, MN (US); Claire Hartmann-Thompson, Lake Elmo, MN (US); Bryan V. Hunt, Anoka, MN (US); Brett J. Sitter, Cottage Grove, MN (US); Kelly A. Volp, Minneapolis, MN (US); Saswata Chakraborty, Cottage Grove, MN (US); Wayne S. Mahoney, St. Paul, MN (US); Tabitha A. Silliman, Woodbury, MN (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 741 days.

This patent is subject to a terminal disclaimer.

(21) Appl. No.: 16/473,841

(22) PCT Filed: Dec. 27, 2017

(86) PCT No.: PCT/IB2017/058440
§ 371 (c)(1),
(2) Date: Jun. 26, 2019

(87) PCT Pub. No.: WO2018/122748
PCT Pub. Date: Jul. 5, 2018

(65) Prior Publication Data
US 2019/0352520 A1    Nov. 21, 2019

Related U.S. Application Data

(60) Provisional application No. 62/439,973, filed on Dec. 29, 2016.

(51) Int. Cl.
*C09D 11/101* (2014.01)
*C08F 220/14* (2006.01)
(Continued)

(52) U.S. Cl.
CPC .......... *C09D 11/101* (2013.01); *C08F 220/14* (2013.01); *C08F 220/38* (2013.01);
(Continued)

(58) Field of Classification Search
CPC ..... C09D 11/101; C09D 11/30; C08F 220/14; C08F 220/38; C08F 220/382;
(Continued)

(56) References Cited

U.S. PATENT DOCUMENTS 4,518,756 A    5/1985  Yoshida
9,150,680 B2 * 10/2015  Kondo .............. C08F 222/1025
(Continued)

FOREIGN PATENT DOCUMENTS

EP    2684903        1/2014
EP    2684903 A1 *  1/2014 ............ C08F 220/18
(Continued)

OTHER PUBLICATIONS

Chwang, "Thin film encapsulated flexible organic electroluminescent displays", Applied physics letters, 2003, vol. 83, No. 3, pp. 413-415.
(Continued)

*Primary Examiner* — Michael M. Bernshteyn
(74) *Attorney, Agent, or Firm* — Jeffrey M. Olofson

(57) ABSTRACT

Curable ink compositions include at least one aromatic (meth)acrylate, at least one multifunctional (meth)acrylate with heteroaromatic groups, fused aromatic groups, heteroalkylene groups, or a group containing both heteroalkylene and aromatic groups, and a photoinitiator. The curable ink composition is Inkjet printable, having a viscosity
(Continued)

of 30 centipoise or less at a temperature of from room temperature to 35° C., and is free from solvents. The ink composition, when printed and cured has a refractive index of 1.55 or greater, and is optically clear. The cured ink composition, when cured to a thickness of from 1-16 micrometers, has a surface roughness of less than or equal to 5 nanometers.

19 Claims, 1 Drawing Sheet

(51) Int. Cl.
*C08F 220/38* (2006.01)
*C08F 222/26* (2006.01)
*C09D 11/30* (2014.01)
*H01L 51/52* (2006.01)
*H01L 51/56* (2006.01)

(52) U.S. Cl.
CPC ............ *C08F 222/26* (2013.01); *C09D 11/30* (2013.01); *H01L 51/5253* (2013.01); *H01L 51/56* (2013.01); *C08F 220/382* (2020.02); *H01L 2251/556* (2013.01); *H01L 2251/558* (2013.01)

(58) Field of Classification Search
CPC .... C08F 222/26; H01L 51/5253; H01L 51/56; H01L 2251/556; H01L 2251/558
USPC ........................................................ 428/500
See application file for complete search history.

(56) References Cited

U.S. PATENT DOCUMENTS

| | | | |
|---|---|---|---|
| 9,164,195 B2 | 10/2015 | Invie | |
| 9,273,185 B2 | 3/2016 | Kariyazono | |
| 2014/0306193 A1 | 10/2014 | Lee | |
| 2015/0057422 A1* | 2/2015 | Kondo | ............. C08F 222/1025 526/325 |
| 2015/0349295 A1 | 12/2015 | Boesch | |
| 2016/0024322 A1 | 1/2016 | Jain | |
| 2021/0061935 A1* | 3/2021 | Mahoney | ................. C09D 4/00 |

FOREIGN PATENT DOCUMENTS

| | | | |
|---|---|---|---|
| JP | 2011-170073 | | 9/2011 |
| JP | 2011170073 A | * | 9/2011 |
| JP | 2013-189532 | | 9/2013 |
| JP | 2013-185040 | | 9/2019 |
| KR | 2012040799 A | * | 4/2012 |
| KR | 20120040799 | | 6/2012 |
| KR | 101254325 | | 4/2013 |
| WO | WO 2016-14690 | | 1/2016 |
| WO | WO 2018-105177 | | 6/2018 |

OTHER PUBLICATIONS

Harkins, "A method for the determination of surface and interfacial tension from the maximum pull on a ring" J. Am. Chem. Soc., 1930, vol. 52, pp. 1751-1772.
Lu, "Improved external coupling efficiency in organic light-emitting devices on high-index substrates", 2000, pp. 25.1.1-25.1.4.
Nuoy, "An Interfacial Tensiometer for Universal Use". The Journal of General Physiology, 1925, vol. 7, No. 5, pp. 625-633.
Szczepanksi, "Accessing photo based morphological control in phase-seperated, cross-linked networks through delayed gelation", European polymer journal, vol. 67, pp. 314-325.
You, "Highly refractive polymer resin derived from sulfur-contaning aromatic acrylate", Journal of Polymer Science: Part A: Polymer Chemistry, 2010, vol. 48, 2604-2609.
International Search report for PCT International Application No. PCT/IB2017/058440 dated Apr. 16, 2018, 7 pages.

* cited by examiner

CURABLE HIGH REFRACTIVE INDEX INK COMPOSITIONS AND ARTICLES PREPARED FROM THE INK COMPOSITIONS

FIELD OF THE DISCLOSURE

This disclosure relates to curable compositions that have a high refractive index relative to typical polymeric compositions, are printable, and can be printed and cured to form articles.

BACKGROUND

Increasingly, optical devices are becoming more complicated and involve more and more functional layers. As light travels through the layers of the optical device, the light can be altered by the layers in a wide variety of ways. For example, light can be reflected, refracted or absorbed. In many cases, layers that are included in optical devices for non-optical reasons adversely affect the optical properties. For example, if a support layer is included that is not optically clear, the absorption of light by the non-optically clear support layer can adversely affect the light transmission of the entire device.

One common difficulty with multi-layer optical devices is that when layers of differing refractive indices are adjacent to each other, refraction of light can occur at their interface. In some devices this refraction of light is desirable, but in other devices the refraction is undesirable. In order to minimize or eliminate this refraction of light at the interface between two layers, efforts have been made to minimize the difference in refractive index between the two layers that form the interface. However, as a wider range of materials have been employed within optical devices, the matching of refractive indices has become increasingly difficult. Organic polymer films and coatings, which are frequently used in optical devices, have a limited range of refractive indices. As higher refractive index materials are increasingly used in optical devices, it has become increasingly difficult to prepare organic polymeric compositions which have suitable optical properties, such as desirable refractive indices and optical clarity, and yet retain the desirable features of organic polymers, such as ease of processing, flexibility, and the like.

SUMMARY

Disclosed herein are curable ink compositions, articles prepared from the curable ink compositions, methods of preparing articles with the curable ink compositions and monomers with desirable properties for preparing the curable ink compositions. In some embodiments, the curable ink composition comprises at least one aromatic (meth)acrylate, at least one multifunctional (meth)acrylate with heteroaromatic groups, fused aromatic groups, heteroalkylene groups, or a group containing both heteroalkylene and aromatic groups, and a photoinitiator. The curable ink composition is inkjet printable, having a viscosity of 30 centipoise or less at a temperature of from room temperature to 35° C., and is free from solvents. The ink composition, when printed and cured has a refractive index of 1.55 or greater, and is optically clear.

Also disclosed are articles, in some embodiment the articles comprise a substrate with a first major surface and a second major surface, a cured organic layer adjacent to at least a portion of the second major surface of the substrate, where the cured organic layer comprises a crosslinked (meth)acrylate-based layer and has a thickness of from 1-16 micrometers, and has a refractive index of 1.55 or greater, and is optically clear; and an inorganic barrier layer in contact with the cured organic layer.

Also disclosed are methods of preparing articles, the methods comprising, providing a substrate with a first major surface and a second major surface, providing a curable ink composition wherein the curable ink composition comprises the curable ink composition described above, disposing the curable ink composition on at least a portion of the second major surface of the substrate to form a curable layer, curing the curable layer to form a cured organic layer, and depositing an inorganic barrier layer on the cured organic layer.

In order to form the curable ink compositions of this disclosure, monomers with specific attributes are utilized. Also disclosed are acrylate compounds with a viscosity of less than 40 centipoise at 25° C. and a refractive index when uncured of less than 1.630 and having a structure of a Formula III:

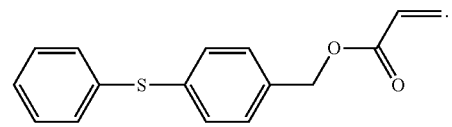

Formula III

BRIEF DESCRIPTION OF THE DRAWINGS

The present application may be more completely understood in consideration of the following detailed description of various embodiments of the disclosure in connection with the accompanying drawings.

Figure 1:
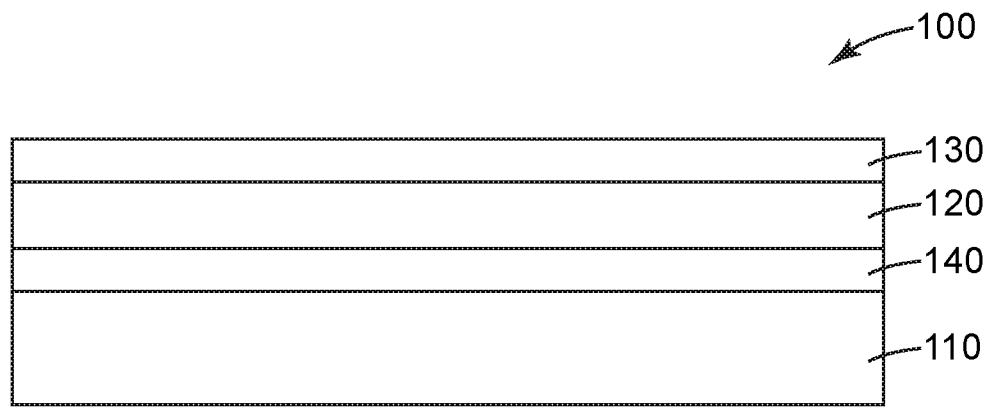
FIG. 1 is a cross sectional view of an embodiment of an article of the present disclosure.

In the following description of the illustrated embodiments, reference is made to the accompanying drawings, in which is shown by way of illustration, various embodiments in which the disclosure may be practiced. It is to be understood that the embodiments may be utilized and structural changes may be made without departing from the scope of the present disclosure. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Optical devices are becoming more and more complex, which impacts the materials used in them. In particular, organic polymeric materials have found widespread use in optical devices, however, they still must meet the stringent requirements and demands needed for performance.

For example, thin organic polymeric films are desirable for a wide range of uses in optical devices, as adhesives, protective layers, spacer layers, and the like. As articles have become more complex, the physical demands upon these layers have increased. For example, as optical devices have become more compact, they often include additional layers, resulting in a growing need for thinner layers. At the same time, since the layers are thinner, the layers also need to be more precise. For example, a thin spacer layer (of 1 micrometer thickness) needs to be level and free of gaps and holes in order to provide the proper spacing function. This requires deposition of the organic layer in a precise and consistent manner.

Additionally, not only do these layers have to fulfill their physical role (adhesion, protection, spacing, and the like) they must also provide the requisite optical properties. Among the properties that are becoming increasingly important is refractive index. As light travels through the layers of a multilayer article, it encounters the interface between layers. If the refractive indices of the layers are different, light can be refracted. Therefore, to minimize this refraction, matching of the refractive indices of layers within a multilayer article is desirable.

Among the methods that have been developed to provide a precise and consistent deposition of organic polymeric material are printing techniques. In printing techniques, a polymer or a curable composition that upon curing forms a polymer are printed onto a substrate surface to form a layer. In the case of printable polymers, typically solvents are added to make the polymer a solution or dispersion capable of being printed. When solvents are used, typically a drying step is necessary after printing to produce the desired polymeric layer. In the case of curable compositions that upon curing form polymers, the curable compositions may or may not include a solvent. If a solvent is used, the layer may also be dried. The curable composition is then cured, typically either with the application of heat or radiation (such as UV light) and a suitable initiator. A wide variety of printing techniques can be used, with inkjet printing being particularly desirable because of the excellent precision on arbitrary substrate shapes and topographies. However, with the increased precision requirements for layer thickness and layer smoothness, the use of inkjet printable inks that contain solvents becomes less desirable as drying of inkjet coated layers can adversely affect the layer thickness and layer smoothness, and solvent can have deleterious effects upon the substrate. Solvents are becoming increasingly disfavored for environmental and economic reasons, as solvent-borne compositions require extra precautions in handling and in drying.

An example of an optical device that utilizes thin film layers are OLED (organic light-emitting diode) devices. In particular, the organic light-emitting devices are susceptible to degradation from the permeation of certain liquids and gases, such as water vapor and oxygen. To reduce permeability to these liquids and gases, barrier coatings are applied to the OLED device, which is known in the art as thin film encapsulation. Typically these barrier coatings are inorganic coatings with a high refractive index. Typically the inorganic barrier coating is not used alone, rather a barrier stack is used which can include multiple dyads. Dyads are two layer structures that include a barrier layer and decoupling layer. The decoupling layer provides a planarized and/or smooth surface for the deposition of the inorganic barrier layer.

US Patent Publication No. 2015/0349295 (Boesch et al.) describes devices that utilize dyads as barrier coatings where the dyads include a first layer (decoupling layer) that is an organic-inorganic hybrid material and the second layer is an inorganic ban-ier layer. The organic-inorganic hybrid decoupling layer includes an organic matrix with either an organometallic polymer or inorganic nanoparticles such that the inorganic material raises the refractive index to better match the inorganic barrier layer refractive index.

However, the organic-inorganic hybrid materials used in US Patent Publication No. 2015/0349295 are not printable. Therefore, the coating methods suitable for use with these materials is limited.

In this disclosure, curable inks that are capable of being printed are described that have a number of traits that make them suitable for the formation of layers within multilayer optical devices. Many of these traits are contradictory to each other, and therefore it is unexpected that an ink composition can combine these contradictory traits. For example, the formulations, when cured, have a relatively high refractive index of greater than 1.55. In order to achieve this high refractive index, aromatic monomers are used, and these aromatic monomers typically have a relatively high viscosity. However, in order to be printable, especially for inkjet printing, the viscosity cannot be too high, otherwise the microscopic nozzles on the printheads can become clogged. Often this viscosity problem can be overcome through the use of solvents to dilute the monomer mixtures and thus reduce their viscosity. The use of solvents is not suitable for the inks of the present disclosure because it is undesirable to have to dry the prepared coatings, and drying defects are known to adversely affect the surface smoothness, which is an important attribute for thin film encapsulation applications. In many applications for optical devices, it is desired that the coatings be precise, that is to say that they do not lose thickness or smoothness upon drying. Therefore the inks of the present disclosure are "100% solids", meaning that they do not contain volatile solvents and that substantially all of the mass that is deposited on a surface remains on the surface. Another technique that can be used to decrease the viscosity of inks is to substantially raise the temperature of the ink. However, this is also not desirable for the inks of the present disclosure because then the substrates need to be heated to at least the same temperature in order to get the inks to spread uniformly on the substrate to achieve the desired surface roughness (such as below 5 nanometer surface roughness). It is not practical to heat up a large substrate in a manufacturing environment due to issues with temperature uniformity and reproducibility of the ink patterns.

Therefore, the curable compositions of the present disclosure are useful as inks, meaning that they are capable of being printed by for example inkjet printing techniques without the use of solvents and at a temperature of from room temperature to 65° C., or more desirably, of from room temperature to 35° C. Typically the printable curable composition has a viscosity at these temperatures of 30 centipoise or less. In some embodiments, the inks have a viscosity of 20 centipoise or less. It is also desirable that the inks have a surface tension in the range of 25-40 dynes/cm. Surface tensions that are lower than this may not be able to escape the nozzle on the printhead and may not form the desirable spherical drop shape. Too high of a surface tension may make it difficult for the ink to spread sufficiently on the substrate to form a thin layer.

Another complicating factor inherent in the use of curable compositions is shelf life. Once materials that are co-reactive are mixed there is the possibility that they can react prematurely. This is a difficulty with compositions, such as inks, since even a small amount of premature reaction can increase the viscosity and make the composition unprintable. Additionally, for practical reasons it is very desirable to have a curable composition that has a useful shelf life. The curable ink compositions of this disclosure have desirable shelf life properties as is shown in the Examples section. The curable ink compositions have shelf life times of at least one week, in many embodiments much longer than one week.

The curable ink composition, when coated and cured to form a cured organic layer, the cured organic layer has a refractive index of at least 1.55 and is optically clear. In some embodiments, the refractive index is at least 1.56, 1.57, 1.58, 1.59, 1.60, 1.61, 1.62, 1.63, 1.64, 1.65, 1.66, 1.67, 1.68, 1.69, or 1.70. As mentioned above, it is desirable that the cured organic layer be thin. In some embodiments, the cured organic layer has a thickness of from 1-16 micrometers and a surface roughness of less than 10 nanometers, in some embodiments less than 5 nanometers. In this way the cured organic layer is suitable for use as a decoupling layer in the thin film encapsulation of an OLED device as described above.

The curable ink composition described herein is a reactive liquid mixture that comprises at least one aromatic (meth) acrylate, at least one multifunctional (meth)acrylate with heteroaromatic, fused aromatic, or a combination of heteroalkylene groups and aromatic groups, and a photoinitiator. All the components are essentially uniformly dissolved in one another to form a solution that is printable.

Also disclosed herein are articles, especially optical articles that comprise multiple layers of films, substrates and coatings. Among the articles of this disclosure are articles comprising a substrate, a cured organic layer adjacent to the substrate, and an inorganic barrier layer disposed on the cured organic layer. The cured organic layer comprises a crosslinked (meth)acrylate-based layer that has a thickness of from 1-16 micrometers, and has a refractive index of 1.55 or greater, and is optically clear. In some embodiments, the refractive index is at least 1.56, 1.57, 1.58, 1.59, 1.60, 1.61, 1.62, 1.63, 1.64, 1.65, 1.66, 1.67, 1.68, 1.69, or 1.70.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

As used herein, the term "adjacent" refers to two layers that are proximate to another layer. Layers that are adjacent may be in direct contact with each other, or there may be an intervening layer. There is no empty space between layers that are adjacent.

The curable ink compositions are "substantially solvent free" or "solvent free". As used herein. "substantially solvent free" refers to the curable ink compositions having less than 5 wt-%, 4 wt-%, 3 wt-%, 2 wt-%, 1 wt-% and 0.5 wt-% of non-polymerizable (e.g. organic) solvent. The concentration of solvent can be determined by known methods, such as gas chromatography (as described in ASTM D5403). The term "solvent free" implies that no solvent is present in the composition. It should be noted that whether the curable ink composition is substantially solvent free or solvent free, no solvent is deliberately added.

Typically the curable ink compositions are described as "100% solids". As used herein, "100% solids" refers to curable ink compositions that do not contain volatile solvents and that all of the mass that is deposited on a surface remains there, no volatile mass is lost from the coating.

The terms "Tg" and "glass transition temperature" are used interchangeably. If measured, Tg values are determined by Differential Scanning Calorimetry (DSC) at a scan rate of 10° C./minute, unless otherwise indicated. Typically, Tg values for copolymers are not measured but are calculated using the well-known Fox Equation, using the Tg values provided by the monomer supplier for homopolymers prepared from those monomers, as is understood by one of skill in the art.

The terms "room temperature" and "ambient temperature" are used interchangeably and have their conventional meaning, that is to say a temperature of from 20-25° C.

The term "organic" as used herein to refer to a cured layer, means that the layer is prepared from organic materials and is free of inorganic materials.

The term "(meth)acrylate" refers to monomeric acrylic or methacrylic esters of alcohols. Acrylate and methacrylate monomers or oligomers are referred to collectively herein as "(meth)acrylates". The term "(meth)acrylate-based" as used herein refers to a polymeric composition that comprises at least one (meth)acrylate monomer and may contain additional (meth)acrylate or non-(meth)acrylate co-polymerizable ethylenically unsaturated monomers. Polymers that are (meth)acrylate based comprise a majority (that is to say greater than 50% by weight) of (meth)acrylate monomers.

The terms "free radically polymerizable" and "ethylenically unsaturated" are used interchangeably and refer to a reactive group which contains a carbon-carbon double bond which is able to be polymerized via a free radical polymerization mechanism.

The term "hydrocarbon group" as used herein refers to any monovalent group that contains primarily or exclusively carbon and hydrogen atoms. Alkyl and aryl groups are examples of hydrocarbon groups.

The term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl.

The term "aryl" refers to a monovalent group that is aromatic and carbocyclic. The aryl can have one to five rings that are connected to or fused to the aromatic ring. The other ring structures can be aromatic, non-aromatic, or combinations thereof, Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

The term "alkylene" refers to a divalent group that is a radical of an alkane. The alkylene can be straight-chained, branched, cyclic, or combinations thereof. The alkylene often has 1 to 20 carbon atoms. In some embodiments, the alkylene contains 1 to 18, 1 to 12, 1 to 10, 1 to 8, 1 to 6, or 1 to 4 carbon atoms. The radical centers of the alkylene can be on the same carbon atom (i.e., an alkylidene) or on different carbon atoms.

The term "heteroalkylene" refers to a divalent group that includes at least two alkylene groups connected by a thio, oxy, or —NR— where R is alkyl. The heteroalkylene can be linear, branched, cyclic, substituted with alkyl groups, or combinations thereof. Some heteroalkylenes are polyoxyalkylenes where the heteroatom is oxygen such as for example,

The term "heteroaromatic" or "heteroaryl" are used interchangeably and as used herein refers to an aromatic ring that contains at least one heteroatom in the ring structure.

The term "arylene" refers to a divalent group that is carbocyclic and aromatic. The group has one to five rings that are connected, fused, or combinations thereof. The other rings can be aromatic, non-aromatic, or combinations thereof. In some embodiments, the arylene group has up to 5 rings, up to 4 rings, up to 3 rings, up to 2 rings, or one aromatic ring. For example, the arylene group can be phenylene.

The term "heteroarylene" refers to a divalent group that is carbocyclic and aromatic and contains heteroatoms such as sulfur, oxygen, nitrogen or halogens such as fluorine, chlorine, bromine or iodine.

The term "aralkylene" refers to a divalent group of formula —$R^a$—$Ar^a$— where $R^a$ is an alkylene and $Ar^a$ is an arylene (i.e., an alkylene is bonded to an arylene).

Unless otherwise indicated, "optically transparent" refers to a layer, film, or article that has a high light transmittance over at least a portion of the visible light spectrum (about 400 to about 700 nm). Typically optically transparent layers, films, or articles have a luminous transmission of at least 80%.

Unless otherwise indicated, "optically clear" refers to an layer, film, or article that has a high light transmittance over at least a portion of the visible light spectrum (about 400 to about 700 nm), and that exhibits low haze. Typically optically clear layers, films, or articles have visible light transmittance values of at least 80%, often at least 90%, and haze values of 5% or less, often 2% or less. Luminous transmission and haze can be measured using the techniques described in the Examples section.

Disclosed herein are curable compositions that are printable, and thus are described as inks. The curable compositions need not be used as inks, that is to say that they need not be printed and then cured, the curable compositions can be delivered to substrate surfaces in a wide variety of ways, but they are capable of being printed. In particular the printable compositions of this disclosure are typically capable of being inkjet printed, which means that they have the proper viscosity and other attributes to be inkjet printed. The term "inkjet printable" is not a process description or limitation, but rather is a material description, meaning that the curable compositions are capable of being inkjet printed, and not that the compositions necessarily have been inkjet printed. This is akin to the expression "hot melt processable", which means that a composition is capable of being hot melt processed but does not mean that the composition has been hot melt processed.

The curable ink compositions of this disclosure comprise at least one aromatic (meth)acrylate, at least one multifunctional (meth)acrylate with heteroaromatic groups, fused aromatic groups, heteroalkylene groups, or a group containing both heteroalkylene and aromatic groups, and a photoinitiator. The ink compositions are inkjet printable and are free from solvents. By free from solvents it is meant that no solvents are added to the curable ink composition, and that no solvents are detectable in the curable composition. The term "solvents" is used herein consistent with the generally stood term of art and encompassing volatile organic and non-organic materials that are liquids at room temperature.

The curable ink compositions of this disclosure when contacted to a substrate surface and cured have a refractive index of 1.55 or greater, and are optically clear. In some embodiments, the refractive index is 1.60 or higher. In some embodiments, the refractive index is at least 1.56, 1.57, 1.58, 1.59, 1.60, 1.61, 1.62, 1.63, 1.64, 1.65, 1.66, 1.67, 1.68, 1.69, or 1.70. Refractive index is measured as described in the Examples section. Typically the curable ink compositions are contacted to a substrate surface by printing, in particular by inkjet printing, but as mentioned above other methods of contacting the curable ink compositions to a substrate surface are also suitable.

One of the attributes requisite to give inkjet printability is viscosity. The curable ink compositions of this disclosure typically have viscosities that make them suitable for inkjet printing. In some embodiments, the curable ink has a viscosity of 30 centipoise or less at a temperature of from room temperature to 65° C. In other embodiments, the curable ink composition has a viscosity of 30 centipoise or less at a temperature of from room temperature to 35° C. As described above, this viscosity is achieved without the use of solvents. Viscosity is measured using standard, well understood techniques as described in the Examples section.

The curable ink compositions of this disclosure, in order to achieve the desired properties of viscosity and refractive index, a mixture of (meth)acrylate monomers are used. The curable ink composition comprises at least one aromatic (Imeth)acrylate, at least one multifunctional (meth)acrylate with heteroaromatic groups, fused aromatic groups, heteroalkylene groups, or a group containing both heteroalkylene and aromatic groups, and a photoinitiator. Each of these components are described in greater detail below.

A wide variety of aromatic (meth)acrylate monomers are suitable for use in the curable ink compositions of this disclosure. Typically, these aromatic (meth)acrylate monomers are monofunctional. A single monofunctional (meth) acrylate monomer may be used or a mixture of monofunctional (meth)acrylate monomers may be used. Generally, the at least one monofunctional (meth)acrylate comprises a compound of Formula I (shown below):

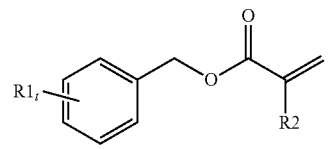

Formula I wherein at least one R1 comprises an aromatic substituent, t is an integer from 1 to 4, and R2 is hydrogen or methyl.

A wide variety of aromatic substituents are suitable for the R1 group or groups. Typically, the at least one aromatic substituent R1 comprises a substituted or unsubstituted aromatic group of the type —$CH_2$—Ar, or a heteroatom linked aromatic group of the type —X—Ar, where X is S or O, and each Ar is independently a substituted or unsubstituted phenyl group, a fused aromatic group, or 2 or more alkyl group-linked phenyl or substituted phenyl or substituted phenyl groups.

Thus, the R1 group or groups may comprise various aromatic substituents such as:

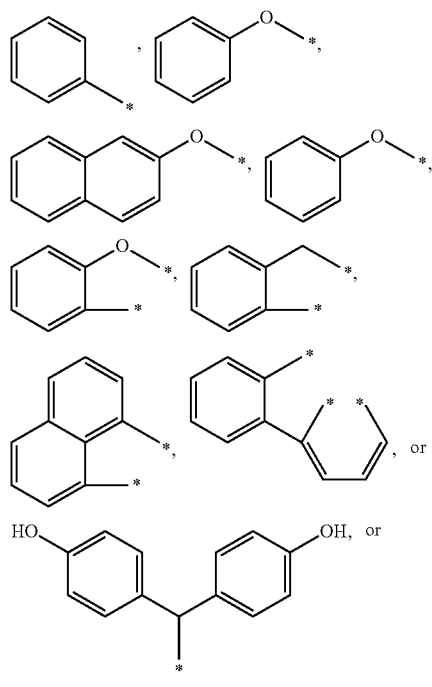

The aromatic substituent R1 is generally bonded to the aromatic ring of the benzyl group by at least one divalent (e.g. alkylene or ether) linking group. In some embodiments, the aromatic substituent R1 is bonded to the aromatic benzyl ring by two or more divalent (e.g. alkylene or ether) linking groups. Each * denotes the point(s) of attachment to the aromatic ring of Formula I; and Ar is a substituted or unsubstituted phenyl group, a fused aromatic group, or 2 or more alkyl group-linked phenyl or substituted phenyl groups.

In some favored embodiments, t is 1. Representative structures for Formula I thus include:

In some of the embodiments where t is 1 and the R1 group is *—S—Ar, the compounds can have the general structure of Formula IA:

Formula IA where R2 is H or $CH_3$, X is O, S, or a single bond, Q is O, S, $SiR_2$ where R is an alkyl group, a carbonyl group (C=O), an amino group NR where R is hydrogen or an alkyl, or an $SO_2$ group, n ranges from 0 to 10 (e.g. n is 0, 1, 2, 3, 4, 5, 6, 7, 8, 9, or 10), and L is an alkylene group having 1 to 5 carbon atoms, optionally substituted with hydroxyl groups.

One particularly suitable monomer of Formula IA is one in which R2 is a hydrogen, n is 1, L is a —$CH_2$— group, X is a single bond, and Q is a sulfur. This monomer is shown below as Formula III:

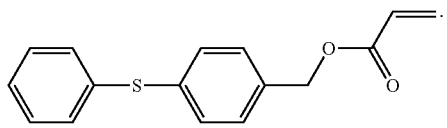

Formula III

While similar compounds to this monomer have been reported in the literature, for example in the Korean Patent Publication No. 101,254,325B1, it has been found that this monomer has particularly desirable viscosity and refractive index features. In particular it has been found that the monomer of Formula III has a viscosity of less than 40 centipoise at 25° C., even a viscosity of 13 centipoise at 25° C., and a refractive index when uncured of less than 1.630, or even less than 1.620.

In other embodiments of the monomers of Formula I, t is greater than 1. In one embodiment, t is 3. One representative structure is:

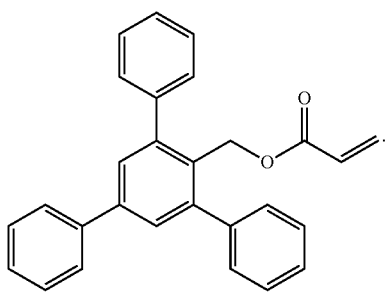 [SMILES: C=CC(=O)OCc1c(-c2ccccc2)cc(-c2ccccc2)cc1-c1ccccc1]

Various aromatic alcohols from Sigma-Aldrich are available as starting materials that can be converted to (meth)acrylates by reacting such materials with (meth)acrylic acid or (meth)acrylic acid derivatives. Particularly suitable monofunctional (meth)acrylate monomers include biphenylmethyl acrylate (where R1 is phenyl group) commercially available from Miwon Specialty Chemicals, Exton, Pa. as MIRMER M1192 or MIRAMER M1192H, and the monomer of Formula III, the synthesis of which is presented in the Examples section.

The amount of aromatic (meth)acrylate monomer employed in the curable ink composition can vary. Typically the aromatic (meth)acrylate monomer is the majority monomer in the curable ink composition. By this it is meant that greater than 50% by weight of the curable ink composition is the aromatic (meth)acrylate monomer. By "the aromatic (meth)acrylate monomer", refers to all of the aromatic (meth)acrylate monomers present if more than one aromatic (meth)acrylate monomer is used. In some embodiments, the curable ink compositions comprise greater than 75% by weight of the aromatic (meth)acrylate monomer. In other embodiments, the curable ink composition comprises 90% by weight or greater of the aromatic (meth)acrylate monomer. As mentioned above, typically the aromatic (meth)acrylate monomer is a monofunctional (meth)acrylate.

In some embodiments, the aromatic (meth)acrylate monomer has a refractive index greater than 1.50 (e.g. at least 1.51 or 1.52) and may have a refractive index of greater than 1.60. Generally these aromatic (meth)acrylate monomers are non-halogenated (e.g. non-brominated). In some embodiments, the aromatic (meth)acrylate monomers have a refractive index of at least 1.53, 1.54, 1.55, 1.56, 1.57, 1.58, 1.59, 1.60, or 1.61 and typically no greater than 1.65.

The curable ink compositions of this disclosure also include at least one multifunctional (meth)acrylate of general Formula II:

$$H_2C=CR2-(CO)-O-A-O-(CO)-R2C=CH_2 \qquad \text{Formula II}$$

where R2 is hydrogen or methyl, (CO) is a carbonyl group C=O, and A is divalent group comprising a heteroaromatic, fused aromatic, or a group containing both heteroalkylene and aromatic groups. Examples of heteroaromatic groups include thiadiazole groups, thiazole groups, and thiophene groups. Examples of fused aromatic groups include naphthyl groups, anthracenyl groups, and fluorenyl groups. Examples of heteroalkylene groups include polyethylene oxide groups, polypropylene oxide groups, polythioether groups, and the like. Examples of groups containing both heteroalkylene and aromatic groups include ones with the difunctional alkylene groups with 2-10 carbon atoms, and have from 1-10 repeat units, and contain difunctional aromatic groups such as phenylene, benzylene, or linked benzylene groups. The compounds that contain groups containing both heteroalkylene and aromatic groups can be described by general Formula IIA:

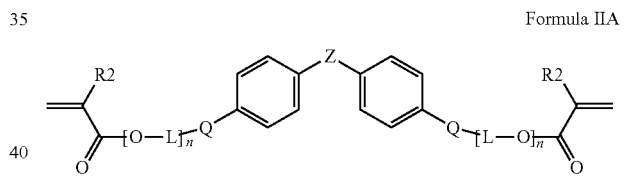

Formula IIA each R2 is independently hydrogen or methyl, Z is —$C(CH_3)_2$—, —$CH_2$—, O, S, or a single bond, each Q is independently O or S, L is an alkylene group comprising 2-12 carbon atoms, and n is an integer ranging from 0 to 10. Typically L comprises a $C_2$-$C_6$ alkylene group, more typically L is $C_2$ or $C_3$ and n is 0, 1, 2 or 3.

Examples of particularly suitable multifunctional (meth)acrylate monomers described by Formula II, include the hetero aromatic compound: 1,3,4-thiadiazole-2,5-diyl(bis (sulfanediyl))bis(ethane-2,1-diyl) diacrylate (TDZDA) the synthesis of which is presented in the Examples section below and which has the structure:

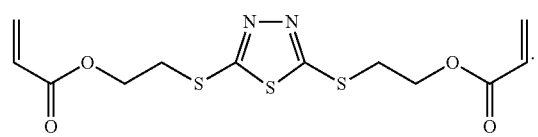 [SMILES: C=CC(=O)OCCSc1nnc(SCCOC(=O)C=C)s1]

Another suitable multifunctional (meth)acrylate monomer is the fused aromatic compound bisphenol fluorene diacrylate commercially available as part of a curable mixture from Miwon Specialty Chemicals, Exton, Pa. as "HR 6042" and which has the structure:

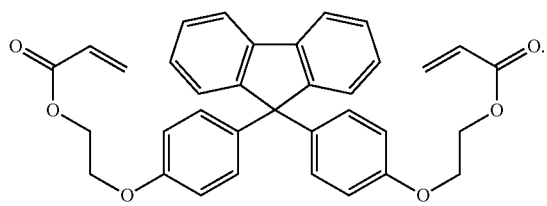 [SMILES: C=CC(=O)OCCOc1ccc(C2(c3ccc(OCCOC(=O)C=C)cc3)c3ccccc3-c3ccccc32)cc1]

Other suitable multifunctional (meth)acrylate monomers are ones of Formula IIA that are bisphenol di(meth)acrylates, i.e. the reaction product of a bisphenol-A diglycidyl ether and acrylic acid. Although bisphenol-A diglycidyl ether is generally more widely available, it is appreciated that other biphenol diglycidyl ether such as bisphenol-F diglycidyl ether could also be employed. One exemplary bisphenol-A ethoxylated diacrylate monomer is commercially available from Sartomer under the trade designations "SR602" (reported to have a viscosity of 610 cps at 20° C. and a Tg of 2° C.). Another exemplary bisphenol-A ethoxylated diacrylate monomer is as commercially available from Sartomer under the trade designation "SR601" (reported to have a viscosity of 1080 cps at 20° C. and a Tg of 60° C.). The general formula for the "SR601" is:

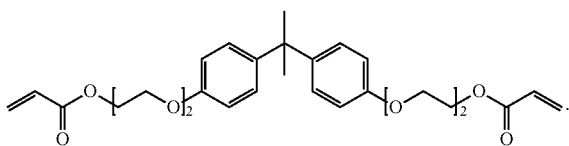

Other multifunctional (meth)acrylate monomers can also be used that have functionalities higher than 2, such as trifunctional, tetrafunctional, and the like. Additionally, mixtures of multifunctional (meth)acrylate monomers can also be used.

Since the multifunctional (meth)acrylate monomers have functionalities of 2 or greater, these monomers serve as crosslinking agents and crosslink the forming polymer. The amount of multifunctional (meth)acrylate monomer is controlled to prevent the polymer from becoming inflexible. Typically the curable ink composition comprises less than 20% by weight of the multifunctional (meth)acrylate monomer or monomers. More typically the curable ink composition comprises 10% or even less than 10% by weight of the multifunctional (meth)acrylate monomer or monomers.

The curable ink composition also comprises at least one photoinitiator, meaning that the initiator is activated by light, generally ultraviolet (UV) light, although other light sources could be used with the appropriate choice of intiator, such a visible light initiators, infrared light initiators, and the like. Typically, UV photoinitiators are used. Photoinitiators are well understood by one of skill in the art of (meth)acrylate polymerization. Examples of suitable free radical photoinitiators include IRGACURE 4265, IRGACURE 184, IRGACURE 651, IRGACURE 1173, IRGACURE 819, IRGACURE TPO, IRGACURE TPO-L, commercially available from BASF, Charlotte, N.C.

Generally the photoinitiator is used in amounts of 0.01 to 10 parts by weight, more typically 0.1 to 2.0, parts by weight relative to 100 parts by weight of total reactive components.

The curable ink composition may contain additional reactive or unreactive components, but such components are not necessary and should be used with care to ensure that they are not detrimental to the final properties of the formed (meth)acrylate-based polymer. As mentioned above, the curable ink composition is substantially free or free of solvent. The ink formulations may also contain polymerization inhibitors, light stabilizers (e.g. hindered amines), synergists, antioxidants, catalysts, dispersants, leveling agents, and the like as needed or desired.

Also disclosed herein are articles, particularly multilayer articles comprising a substrate, and an inorganic barrier layer, with a cured organic layer between them, where the cured layer functions as a decoupling layer. The substrate may optionally have an inorganic coating layer present on its surface, so that the cured organic layer may be in contact with substrate surface or with the optional inorganic coating layer.

This article is shown in FIG. 1, where article 100 comprises substrate 110 with cured organic layer 120 adjacent to the substrate, and inorganic barrier layer 130 in contact with cured organic layer 120. FIG. 1 also includes optional inorganic layer 140 which is in contact with substrate 110 and in contact with cured organic layer 120.

Substrate 110 includes a wide array of flexible and non-flexible substrates. For example substrate 110 may be glass or a relatively thick layer of a polymeric material such as PMMA (polymethyl methacrylate) or PC (polycarbonate). Alternatively, substrate 110 may be flexible polymeric film such as films of PET (polyethylene terephthalate), PEN (polyethylene naphthalate), PC (polycarbonate), polyimide, PEEK (polyetherether ketone), and the like.

Cured organic layer 120 is a (meth)acrylate-based cured layer of the curable ink compositions described above. Again, it is important to note that while the curable composition is described as an "ink", this just means that the composition is printable and not necessarily that the cured organic layer 120 has been printed, since as described above, other coating methods can also be used. In many embodiments, however, the cured organic layer 120 has been coated by printing, especially inkjet printing, and then has been cured. Cured organic layer 120 has all of the properties described above, namely the layer has a thickness of from 1-16 micrometers, the layer has a refractive index of 1.55 or greater, and is optically clear. Additionally, in many embodiments, the cured organic layer 120 has a surface roughness of less than or equal to 10 nanometers, in some embodiments less than or equal to 5 nanometers.

The inorganic layer barrier layer 130 in contact with cured organic layer 120 can be prepared from a variety of materials including metals, metal oxides, metal nitrides, metal oxynitrides, metal carbides, metal oxyborides, and combinations thereof. A wide range of metals are suitable use in the metal oxides, metal nitrides, and metal oxynitrides, particularly suitable metals include Al, Zr, Si, Zn, Sn, and Ti.

While the refractive index of the inorganic barrier layer 130 is not particularly limited, generally it is greater than 1.60, and in many embodiments the refractive index of the inorganic barrier layer is 1.70 or greater. One particularly suitable inorganic barrier layer material is silicon nitride.

The thickness of the inorganic barrier layer 130 is not particularly limited, generally it is between 20 nanometers and 1 micrometer (1000 nanometers). More typically the thickness is from 20 nanometers to 100 nanometers.

The inorganic barrier layer can be deposited on the cured organic layer 120 in a variety of ways. In general, any suitable deposition method can be utilized. Examples of suitable methods include vacuum processes such as sputtering, chemical vapor deposition, metal-organic chemical vapor deposition, plasma enhanced chemical vapor deposition, evaporation, sublimation, electron cyclotron resonance-plasma enhanced chemical vapor deposition, and combinations thereof.

In many embodiments, the substrate 110 has inorganic layer 140 disposed thereon. In these embodiments, the cured organic layer 120 is in contact with the inorganic layer 140 instead of being in direct contact with the substrate 110 itself. The inorganic layer 140 is similar to inorganic barrier layer 130, and may in fact be a barrier layer. The composition and properties of inorganic layer 140 are the same as for inorganic barrier layer 130. Inorganic layer 140 and inorganic barrier layer 130 may comprise the same material composition or they may be different.

Figure 2:
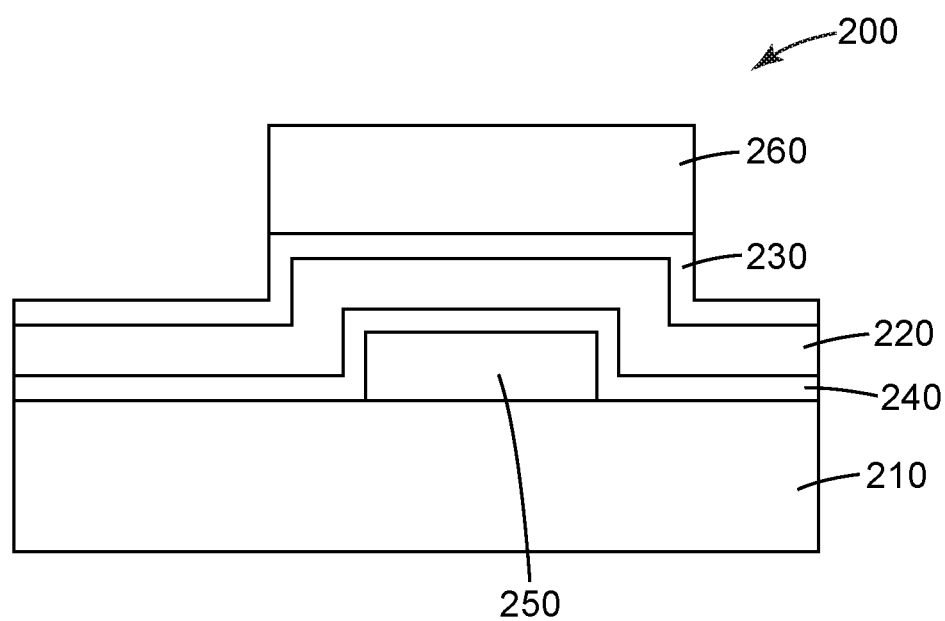
FIG. 2 is a cross sectional view of a device that contains an article of the present disclosure.

FIG. 2 shows a device that includes the multilayer article of the present disclosure. FIG. 2 shows device 200 comprising substrate 210 with device 250 disposed on substrate 210. As with FIG. 1 above, cured organic layer 220 is adjacent to the substrate and device 250, and inorganic barrier layer 230 in contact with cured organic layer 220. FIG. 2 also includes optional inorganic layer 240 that is in contact with substrate 210 and device 250 and is in contact with cured organic layer 220. Optional layer 260 may be a single layer or multiple layers and may include both organic and inorganic layers and may include adhesive layers, optical layers, and the like. Layers 210 (substrate), 220 (cured organic layer), 230 (inorganic barrier layer), and 240 (optional inorganic layer) are the same as described above for FIG. 1.

Device 250 may comprise a variety of devices, especially optical devices that for which the use of an inorganic barrier layer is useful. Among the particularly suitable devices are OLED devices. OLED devices have been described above.

Also disclosed herein are methods for preparing articles, especially optical articles. These methods comprise, providing a substrate with a first major surface and a second major surface, providing a curable ink composition, disposing the curable ink composition on the second major surface of the substrate to form a curable layer, and curing the curable layer to form a cured organic layer with thickness of from 1-16 micrometers, where the cured organic layer has a refractive index of 1.55 or greater and is optically clear. In some embodiments, the refractive index is at least 1.56, 1.57, 1.58, 1.59, 1.60, 1.61, 1.62, 1.63, 1.64, 1.65, 1.66, 1.67, 1.68, 1.69, or 1.70. In many embodiments, the surface roughness of the cured organic layer is less than 10 nanometers, in some embodiments less than or equal to 5 nanometers. To the surface of this cured organic layer is deposited an inorganic barrier layer.

In many embodiments, the disposing of the curable ink composition on the second major surface of the substrate to form a curable layer comprises printing, especially inkjet printing. As described above, inkjet printing has a variety of desirable features that make it particularly suitable for preparing the curable layer, including the ability to deposit precise patterns on complex substrates and form a uniform coating with a surface roughness that is less than 10 nanometers, in some embodiments less than or equal to 5 nanometers.

The curable ink compositions used in this method are the curable ink compositions described above. Since the curable ink compositions include a photoinitiator, curing of the curable layer comprise photo curing. The nature of the photoinitiator determine the curing conditions, i.e. radiation wavelength used, duration of the exposure to radiation, etc.

As described above, the articles of this disclosure may include additional elements. In some embodiments, the method may further comprise providing a device such as an OLED, and placing the device on the second major surface of the substrate prior to disposing the curable ink composition on the second major surface of the substrate to form a curable layer. Also, the article may further comprise an inorganic layer disposed on the substrate and device surfaces. In these embodiments, the inorganic layer is disposed on the substrate and device surfaces prior to disposing the curable ink composition on the second major surface of the substrate to form a curable layer. Additionally, as described above, additional layers may be added to the exposed surface of the inorganic barrier after the inorganic barrier layer is disposed on the cured organic layer.

The disclosure includes the following embodiments:

Among the embodiments are curable ink compositions. Embodiment 1 includes a curable ink composition comprising: at least one aromatic (meth)acrylate; at least one multifunctional (meth)acrylate with heteroaromatic groups, fused aromatic groups, heteroalkylene groups, or a group containing both heteroalkylene and aromatic groups; and a photoinitiator; wherein the ink composition is inkjet printable and is free from solvents, and wherein the ink composition when printed and cured has a refractive index of 1.55 or greater, and is optically clear.

Embodiment 2 is the curable ink composition of embodiment 1, wherein the ink composition has a viscosity of 30 centipoise or less at a temperature of from room temperature to 65° C.

Embodiment 3 is the curable ink composition of embodiment 1 or 2, wherein the ink composition has a viscosity of 30 centipoise or less at a temperature of from room temperature to 35° C.

Embodiment 4 is the curable ink composition of any of embodiments 1-3, wherein the at least one aromatic (meth)acrylate comprises a compound of Formula I:

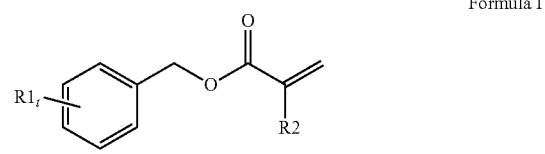

Formula I wherein at least one R1 comprises an aromatic substituent; t is an integer from 1 to 4; and R2 is hydrogen or methyl.

Embodiment 5 is the curable ink composition of embodiment 4, wherein the compound comprises at least one aromatic substituent R1 comprising: a substituted or unsubstituted aromatic group of the type —CH$_2$—Ar; or a heteroatom linked aromatic group of the type —X—Ar, where X is S or O, and each Ar is independently a substituted or unsubstituted phenyl group, a fused aromatic group, or 2 or more alkyl group-linked phenyl or substituted phenyl or substituted phenyl groups.

Embodiment 6 is the curable ink composition of embodiment 4 or 5, wherein the at least one R1 group comprises:

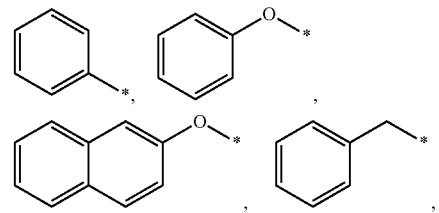

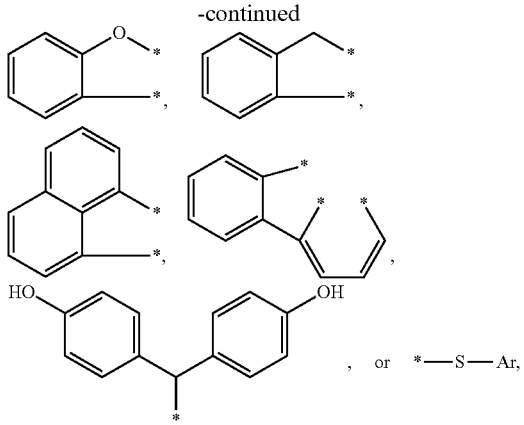

where each * denotes the point(s) of attachment to the aromatic ring of Formula I; and Ar is a substituted or unsubstituted phenyl group, a fused aromatic group, or 2 or more alkyl group-linked phenyl or substituted phenyl or substituted phenyl groups.

Embodiment 7 is the curable ink composition of any of embodiments 1-6, wherein the at least one aromatic (meth) acrylate comprises a compound of Formula IA:

Formula IA

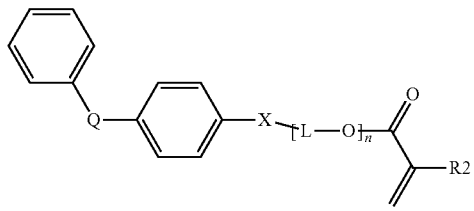

wherein R2 is H or CH$_3$; X is O, S, or a single bond, Q is O, S, SiR$_2$ where R is an alkyl group, a carbonyl group (C=O), n amino group NR where R is hydrogen or an alkyl, or an SO$_2$ group; n ranges from 0 to 10; and L is an alkylene group having 1 to 5 carbon atoms, optionally substituted with hydroxyl groups.

Embodiment 8 is the curable ink composition of embodiment 7, wherein R2 is a hydrogen; n is 1, L is a —CH$_2$— group, X is a single bond, and Q is a sulfur.

Embodiment 9 is the curable ink composition of any of embodiments 1-8, wherein the aromatic (meth)acrylate has a viscosity of less than 40 centipoise at 25° C. and a refractive index when uncured of less than 1.630 and having a structure of a Formula III:

Formula III

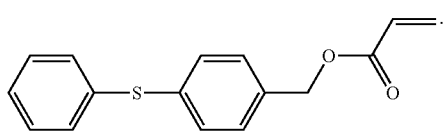

Embodiment 10 is the curable ink composition of any of embodiments 1-9, wherein the at least one aromatic (meth) acrylate has a refractive index of at least 1.50.

Embodiment 11 is the curable ink composition of any of embodiments 1-10, wherein the at least one multifunctional (meth)acrylate comprises Formula II:

$$H_2C=CR2-(CO)-O-A-O-(CO)-R2C=CH_2$$  Formula II wherein R2 is hydrogen or methyl; (CO) is a carbonyl group C=O; and A is divalent group comprising a heteroaromatic group, a fused aromatic group, or a group containing both heteroalkylene and aromatic groups.

Embodiment 12 is the curable ink composition of embodiment 11, wherein the A group comprises a fluorenyl group, or thiadiazole group.

Embodiment 13 is the curable ink composition of embodiment 11 or 12, wherein the at least one multifunctional (meth)acrylate comprises Formula IIA:

Formula IIA

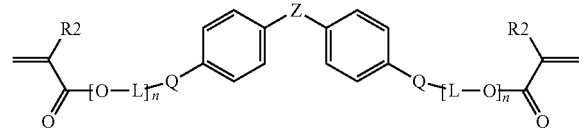

wherein each R2 is independently hydrogen or methyl; Z is —C(CH$_3$)$_2$—, —CH$_2$—, O, S, or a single bond; each Q is independently O or S; L is an alkylene group comprising 2-12 carbon atoms; and n is an integer ranging from 0 to 10.

Embodiment 14 is the curable ink composition of embodiment 13, wherein L comprises a C$_2$-C$_6$ alkylene group; Z is —C(CH$_3$)$_2$—, —CH$_2$—; and n is 0, 1, 2 or 3.

Embodiment 15 is the curable ink composition of any of embodiments 1-13, wherein the at least one multifunctional (meth)acrylate comprises:

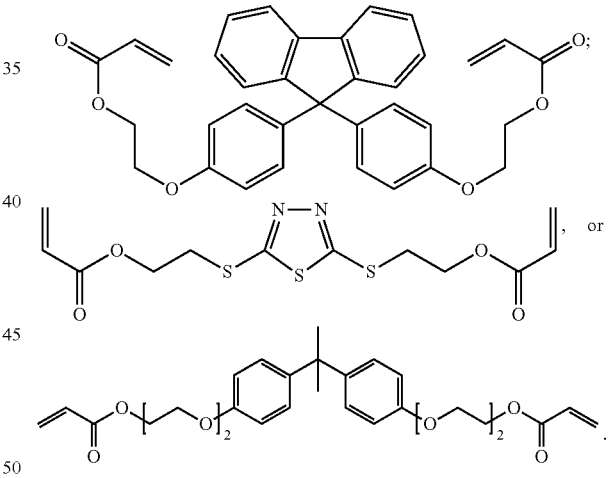

Embodiment 16 is the curable ink composition of any of embodiments 1-15, wherein the ink composition comprises greater than 50% by weight of aromatic (meth)acrylate.

Embodiment 17 is the curable ink composition of any of embodiments 1-16, wherein the ink composition comprises greater than 75% by weight of aromatic (meth)acrylate.

Embodiment 18 is the curable ink composition of any of embodiments 1-17, wherein the ink composition comprises greater than 90% by weight of aromatic (meth)acrylate.

Embodiment 19 is the curable ink composition of any of embodiments 1-18, wherein the ink composition when cured to a thickness of from 1-16 micrometers, has a surface roughness of less than or equal to 5 nanometers.

Also disclosed are embodiments of articles. Embodiment 20 includes an article comprising: a substrate with a first major surface and a second major surface; a cured organic layer adjacent to at least a portion of the second major surface of the substrate, wherein the cured organic layer comprises a crosslinked (meth)acrylate-based layer and has a thickness of from 1-16 micrometers, and has a refractive index of 1.55 or greater, and is optically clear; and an inorganic barrier layer in contact with the cured organic layer.

Embodiment 21 is the article of embodiment 20, wherein the substrate comprises an inorganic coating layer present on the second major surface, such that the cured organic layer is in contact with the inorganic coating layer.

Embodiment 22 is the article of embodiment 20 or 21, wherein the cured organic layer comprises a curable ink composition that has been printed and cured on at least a portion of the second major surface of the substrate, wherein the curable ink composition comprises: at least one aromatic (meth)acrylate: at least one multifunctional (meth)acrylate with heteroaromatic groups, fused aromatic groups, heteroalkylene groups, or a group containing both heteroalkylene and aromatic groups; and a photoinitiator; and wherein the curable ink composition is inkjet printable and is free from solvents.

Embodiment 23 is the article of any of embodiments 20-22, wherein the cured organic layer has a surface roughness of less than 5 nanometers.

Embodiment 24 is the article of any of embodiments 20-23, wherein the inorganic barrier layer has a refractive index of 1.70 or greater.

Embodiment 25 is the article of embodiment 22, wherein the inorganic coating layer has a refractive index of 1.70 or greater.

Embodiment 26 is the article of any of embodiments 20-25, wherein the article further comprises a device disposed on the second major surface of the substrate, and adjacent to the cured organic layer.

Embodiment 27 is the article of embodiment 26, further comprising an inorganic coating layer disposed on the device and on the second major surface of the substrate, such that the cured organic layer is in contact with the inorganic coating layer.

Embodiment 28 is the article of embodiment 26, further comprising additional substrates or layers in contact with the substrate, the inorganic barrier layer or both.

Embodiment 29 is the article of any of embodiments 26-28, wherein the device comprises an OLED (organic light-emitting diode).

Embodiment 30 is the article of any of embodiments 22-29, wherein the curable ink composition has a viscosity of 30 centipoise or less at a temperature of from room temperature to 65° C.

Embodiment 31 is the article of any of embodiments 22-30, wherein the curable ink composition has a viscosity of 30 centipoise or less at a temperature of from room temperature to 35° C.

Embodiment 32 is the article of any of embodiments 22-31, wherein the at least one aromatic (meth)acrylate comprises a compound of Formula I:

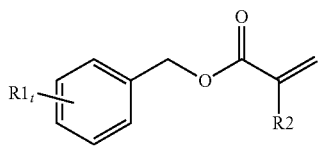

Formula I wherein at least one R1 comprises an aromatic substituent; t is an integer from 1 to 4; and R2 is hydrogen or methyl.

Embodiment 33 is the article of embodiment 32, wherein the compound comprises at least one aromatic substituent R1 comprising: a substituted or unsubstituted aromatic group of the type —$CH_2$—Ar; or a heteroatom linked aromatic group of the type —X—Ar, where X is S or O, and each Ar is independently a substituted or unsubstituted phenyl group, a fused aromatic group, or 2 or more alkyl group-linked phenyl or substituted phenyl or substituted phenyl groups.

Embodiment 34 is the article of embodiment 32 or 33, wherein the at least one R1 group comprises:

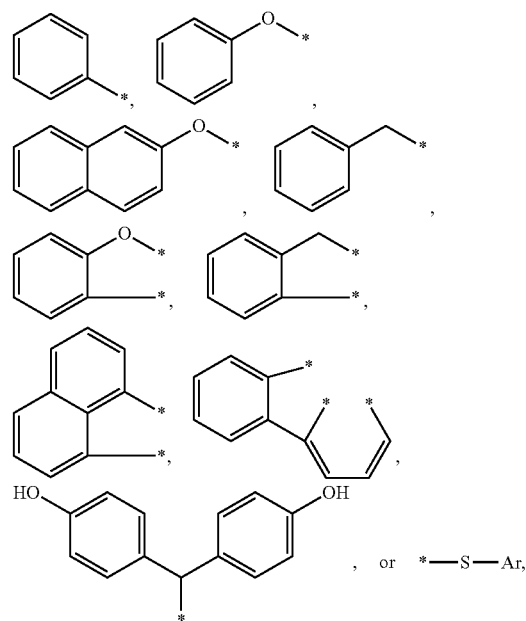

, or *—S—Ar, where each * denotes the point(s) of attachment to the aromatic ring of Formula I; and Ar is a substituted or unsubstituted phenyl group, a fused aromatic group, or 2 or more alkyl group-linked phenyl or substituted phenyl or substituted phenyl groups.

Embodiment 35 is the article of any of embodiments 22-34, wherein the at least one aromatic (meth)acrylate comprises a compound of Formula IA:

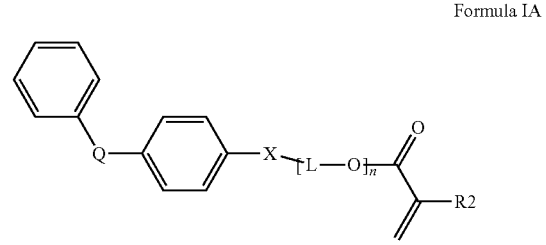

Formula IA wherein R2 is H or $CH_3$; X is O, S, or a single bond, Q is O, S, $SiR_2$ where R is an alkyl group, a carbonyl group (C=O), an amino group NR where R is hydrogen or an alkyl, or an $SO_2$ group; n ranges from 0 to 10; and L is an alkylene group having 1 to 5 carbon atoms, optionally substituted with hydroxyl groups.

Embodiment 8 is the curable ink composition of embodiment 7, wherein R2 is a hydrogen; n is 1, L is a —$CH_2$— group, X is a single bond, and Q is a sulfur.

Embodiment 36 is the article of any of embodiments 22-35, wherein the aromatic (meth)acrylate has a viscosity of less than 40 centipoise at 25° C. and a refractive index when uncured of less than 1.630 and having a structure of a Formula III:

Formula III

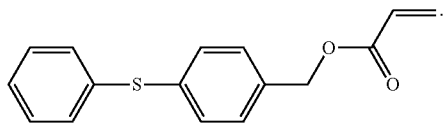

Embodiment 37 is the article of any of embodiments 22-36, wherein the at least one aromatic (meth)acrylate has a refractive index of at least 1.50.

Embodiment 38 is the article of any of embodiments 22-37, wherein the at least one multifunctional (meth)acrylate comprises Formula II:

$$H_2C=CR2\text{-}(CO)\text{---}O\text{-}A\text{-}O\text{---}(CO)\text{---}R2C=CH_2 \quad \text{Formula II}$$

wherein R2 is hydrogen or methyl; (CO) is a carbonyl group C=O; and A is divalent group comprising a heteroaromatic group, a fused aromatic group, or a group containing both heteroalkylene and aromatic groups.

Embodiment 39 is the article of embodiment 38, wherein the A group comprises a fluorenyl group, or thiadiazole group.

Embodiment 40 is the article of embodiment 38 or 39, wherein the at least one multifunctional (meth)acrylate comprises Formula IIA:

Formula IIA

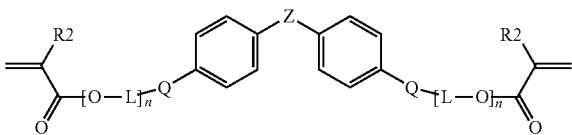

wherein each R2 is independently hydrogen or methyl; Z is —C(CH$_3$)$_2$—, —CH$_2$—, O, S, or a single bond; each Q is independently O or S; L is an alkylene group comprising 2-12 carbon atoms; and n is an integer ranging from 0 to 10.

Embodiment 41 is the article of embodiment 40, wherein L comprises a C$_2$-C$_6$ alkylene group; Z is —C(CH$_3$)$_2$—, —CH$_2$—; and n is 0, 1, 2 or 3.

Embodiment 42 is the article of any of embodiments 22-41, wherein the at least one multifunctional (meth)acrylate comprises:

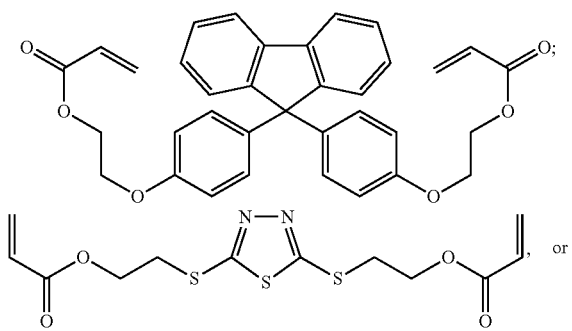

, or

-continued

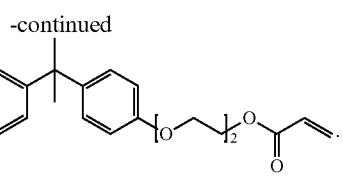

Embodiment 43 is the article of any of embodiments 22-42, wherein the ink composition comprises greater than 50% by weight of aromatic (meth)acrylate.

Embodiment 44 is the article of any of embodiments 22-43, wherein the ink composition comprises greater than 75% by weight of aromatic (meth)acrylate.

Embodiment 45 is the article of any of embodiments 22-44, wherein the ink composition comprises greater than 90% by weight of aromatic (meth)acrylate.

Also disclosed are methods of preparing articles. Embodiment 46 includes a method of preparing an article comprising: providing a substrate with a first major surface and a second major surface; providing a curable ink composition wherein the curable ink composition comprises: at least one aromatic (meth)acrylate; at least one multifunctional (meth)acrylate with heteroaromatic groups, fused aromatic groups, heteroalkylene groups, or a group containing both heteroalkylene and aromatic groups; and a photoinitiator; and wherein the curable ink composition is free from solvents, and wherein the ink composition when printed and cured has a refractive index of 1.55 or greater, and is optically clear; disposing the curable ink composition on at least a portion of the second major surface of the substrate to form a curable layer; curing the curable layer to form a cured organic layer; and depositing an inorganic barrier layer on the cured organic layer.

Embodiment 47 is the method of embodiment 46, wherein disposing of the curable ink composition on the second major surface of the substrate to form a curable layer comprises inkjet printing.

Embodiment 48 is the method of embodiment 46 or 47, wherein cured organic layer has a surface roughness that is less than or equal to 5 nanometers.

Embodiment 49 is the method of any of embodiments 46-48, wherein curing comprises photo curing.

Embodiment 50 is the method of embodiment 49, wherein photo curing comprises providing actinic radiation comprising visible light, ultraviolet light, or infrared light.

Embodiment 51 is the method of any of embodiments 46-50, wherein the cured organic layer has a thickness of from 1-16 micrometers.

Embodiment 52 is the method of any of embodiments 46-51, further comprising providing a device; and disposing the device on the second major surface of the substrate prior to disposing the curable ink composition on the second major surface of the substrate to form a curable layer.

Embodiment 53 is the method of embodiment 52, further comprising disposing an inorganic layer on the substrate and device surfaces prior to disposing the curable ink composition on the second major surface of the substrate to form a curable layer.

Embodiment 54 is the method of embodiment 52, further comprising disposing additional layers to an exposed surface of the inorganic barrier layer after the inorganic barrier layer is disposed on the cured organic layer.

Embodiment 55 is the method of any of embodiments 52-54, wherein the device comprises an OLED (organic light-emitting diode).

Embodiment 56 is the method of any of embodiments 46-55, wherein the curable ink composition has a viscosity of 30 centipoise or less at a temperature of from room temperature to 65° C.

Embodiment 57 is the method of any of embodiments 46-56, wherein the curable ink composition has a viscosity of 30 centipoise or less at a temperature of from room temperature to 35° C.

Embodiment 58 is the method of any of embodiments 46-57, wherein the at least one aromatic (meth)acrylate comprises a compound of Formula I:

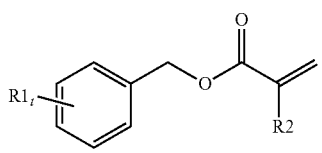

Formula I wherein at least one R1 comprises an aromatic substituent; t is an integer from 1 to 4; and R2 is hydrogen or methyl.

Embodiment 59 is the method of embodiment 58, wherein the compound comprises at least one aromatic substituent R1 comprising: a substituted or unsubstituted aromatic group of the type —CH$_2$—Ar; or a heteroatom linked aromatic group of the type —X—Ar, where X is S or O, and each Ar is independently a substituted or unsubstituted phenyl group, a fused aromatic group, or 2 or more alkyl group-linked phenyl or substituted phenyl or substituted phenyl groups.

Embodiment 60 is the method of embodiment 58 or 59, wherein the at least one R1 group comprises:

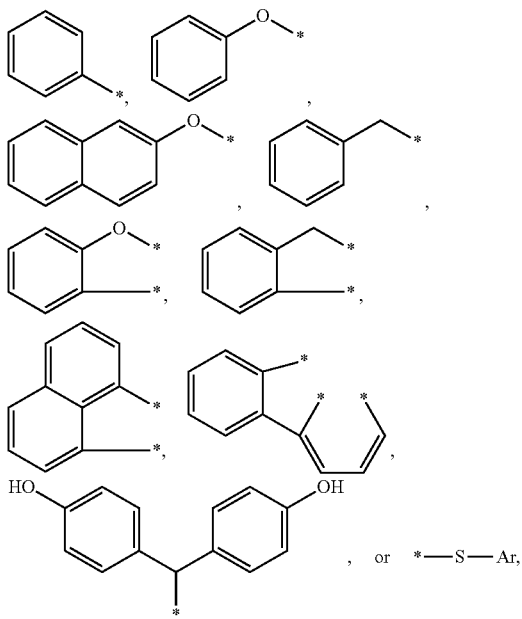

where each * denotes the point(s) of attachment to the aromatic ring of Formula I; and Ar is a substituted or unsubstituted phenyl group, a fused aromatic group, or 2 or more alkyl group-linked phenyl or substituted phenyl or substituted phenyl groups.

Embodiment 61 is the method of any of embodiments 46-60, wherein the at least one aromatic (meth)acrylate comprises a compound of Formula IA:

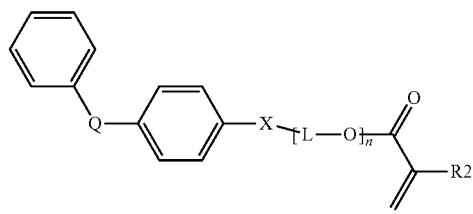

Formula IA wherein R2 is H or CH$_3$; X is O, S, or a single bond, Q is O, S, SiR$_2$ where R is an alkyl group, a carbonyl group (C=O), an amino group NR where R is hydrogen or an alkyl, or an SO$_2$ group; n ranges from 0 to 10; and L is an alkylene group having 1 to 5 carbon atoms, optionally substituted with hydroxyl groups.

Embodiment 8 is the curable ink composition of embodiment 7, wherein R2 is a hydrogen; n is 1, L is a —CH$_2$— group, X is a single bond, and Q is a sulfur.

Embodiment 62 is the method of any of embodiments 46-61, wherein the aromatic (meth)acrylate has a viscosity of less than 40 centipoise at 25° C. and a refractive index when uncured of less than 1.630 and having a structure of a Formula III:

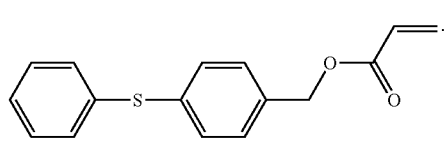

Formula III

Embodiment 63 is the method of any of embodiments 46-62, wherein the at least one aromatic (meth)acrylate has a refractive index of at least 1.50.

Embodiment 64 is the method of any of embodiments 46-63 wherein the at least one multifunctional (meth)acrylate comprises Formula II:

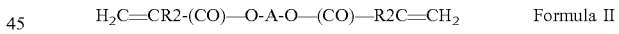

H$_2$C=CR2-(CO)—O-A-O—(CO)—R2C=CH$_2$    Formula II wherein R2 is hydrogen or methyl; (CO) is a carbonyl group C=O; and A is divalent group comprising a heteroaromatic group, a fused aromatic group, or a group containing both heteroalkylene and aromatic groups.

Embodiment 65 is the method of embodiment 64, wherein the A group comprises a fluorenyl group, or thiadiazole group.

Embodiment 66 is the method of embodiment 64 or 65, wherein the at least one multifunctional (meth)acrylate comprises Formula IIA:

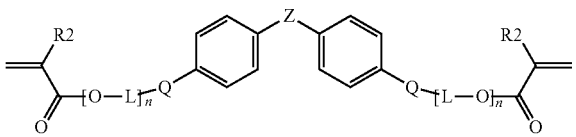

Formula IIA wherein each R2 is independently hydrogen or methyl; Z is —C(CH$_3$)$_2$—, —CH$_2$—, O, S, or a single bond; each Q is independently O or S; L is an alkylene group comprising 2-12 carbon atoms; and n is an integer ranging from 0 to 10.

Embodiment 67 is the method of embodiment 66, wherein L comprises a $C_2$-$C_6$ alkylene group; Z is —C(CH$_3$)$_2$—, —CH$_2$—; and n is 0, 1, 2 or 3.

Embodiment 68 is the method of any of embodiments 46-67, wherein the at least one multifunctional (meth)acrylate comprises:

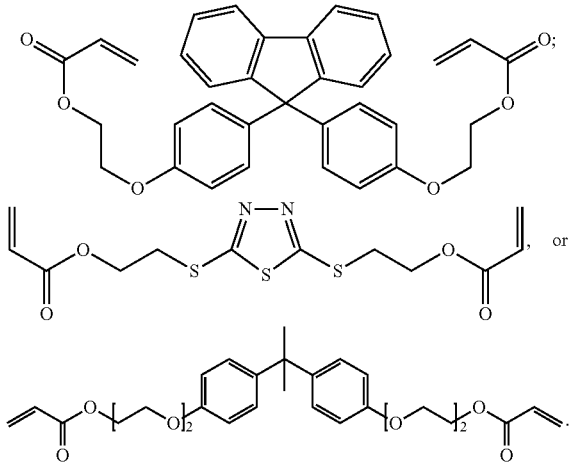

Embodiment 69 is the method of any of embodiments 46-68, wherein the ink composition comprises greater than 50% by weight of aromatic (meth)acrylate.

Embodiment 70 is the method of any of embodiments 46-69, wherein the ink composition comprises greater than 75% by weight of aromatic (meth)acrylate.

Embodiment 71 is the method of any of embodiments 46-70, wherein the ink composition comprises greater than 90% by weight of aromatic (meth)acrylate.

Also disclosed are embodiments of curable acrylates. Embodiment 72 includes a curable acrylate compound with a viscosity of less than 40 centipoise at 25° C. and a refractive index when uncured of less than 1.630 and having a structure of a Formula III:

Formula III

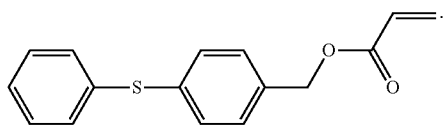

EXAMPLES

High refractive-index inkjet ink compositions were prepared. The materials were applied to substrates and the physical, optical and mechanical properties were evaluated as shown in the following examples. These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company, St. Louis, Mo. unless otherwise noted.

TABLE 1

Table of materials used in the examples

| Material Abbreviation | Description |
|---|---|
| M1 | Biphenylmethyl acrylate, available from Miwon Inc. Exton, PA., as MIRAMER M1192H |
| M2 | Bisphenol fluorene diacrylate available from Miwon Inc. Exton, PA., as MIRAMER HR6060 |
| PH1 | Photoinitiator, 50/50 mixture of 1-2-hydroxy-2-methyl-1-phenyl-Propanone/diphenyl(2,4,6,-trimethylbenzoyl) phosphine oxide available from BASF Wyandotte, MI., as IRGACURE 4265 |
| $Si_3N_4$ | 500 nm PECVD deposited film on silicon water, available from Silicon Valley Microelectronics (Santa Clara, CA) |
| INK1 | Ink, Mimaki UV Curable Clear Ink available from US Cutter Inc., Redmond, WA., as LH100-CL-BA |
| S1 | Para-(phenylthio) benzyl alcohol available from Alfa Chemistry, Holtsville, NY |
| DCM | $CH_2Cl_2$ Dichloromethane available from EMD Millipore part of Merck KGaA, Darmstadt, Germany |
| TEA | Triethylamine available from EMD Millipore part of Merck KGaA, Darmstadt, Germany |
| S2 | Hexane available from EMD Millipore part of Merck KGaA, Darmstadt, Germany |
| S3 | Ethyl acetate available from EMD Millipore part of Merck KGaA, Darmstadt, Germany |
| BHT | Inhibitor 2,6-Di-tert-butyl-4-methylphenol, available from Alfa Aesar, Haverhill, MA |

Test Methods

Sample Coating

Coatings for the optical tests were made on 2 mil thick PET (MELINEX 542, TEKRA Inc., New Berlin, Wis.) using a wire-wound rod (Model: RDS10, RDS Specialties, Webster, N.Y.). Ultraviolet (UV) curing of the films was performed immediately after coating using a "Light Hammer" system (Heraeus Noblelight Fusion UV Inc., Gaithersburg, Md.) using a "D-bulb" with two passes of the conveyor belt running at 30 feet per minute.

Test Method 1: Transmission, Haze, Clarity, and b* Measurements

The measurement of average % transmission was conducted with a haze meter (BYK Gardiner, under the trade designation "BYK HAZEGARD Plus, Columbia, Md.") based on ASTM D1003-11. b* was measured using an X-Rite™ SP62 portable spectrophotometer (X-Rite, Grand Rapids, Mich.).

Test Method 2: Refractive Index Measurements

The refractive index of the uncured liquid ink was measured using an an automatic digital refractometer (Model: J357, Rudolph Research, Hackettstown, N.J.). After coating and UV-curing, cured ink films on PET substrates were measured using a digital prisn coupler (Model 2010, Metricon Inc., Pennington, N.J.) at 404 nm, 532 nm and 632.8 nm following the method outlined in ASTM C1648-12.

Test Method 3: Adhesion Test

For the adhesion tests, a glass syringe with a 23 gauge needle was used to deposit 1 drop (~0.06 ml) on the surface of the glass slides or the silicon nitride ($Si_3N_4$) wafer while the needle was in light contact with the substrate. The substrates were UV cured as described above. The glass syringe was cleaned between each sample with acetone and isopropanol, and a new needle was used for each sample. A strip of new, unused 810 SCOTCH MAGIC tape (3M Company, St. Paul Minn.) was pressed down to the cured adhesive with a squeegee for two seconds then rapidly pulled up. Any amount of adhesive that was removed was recorded as a fail. The films were scored by assigning a "1" to a pass, and "0" to a fail. It was important there were no bubbles caused by debris between the adhesive and the substrate and the test was not conducted on an edge, as both artifacts could cause a failure. On the glass substrate, three tape peels per sample were performed and averaged to give the values below. On the silicon nitride substrate, only one tape peel per sample was performed.

Test Method 4: Cross-Hatch Adhesion Test

ASTM D3359.17656-1 defines parameters for the cross-hatch adhesion test. This test defines a method to score 8 overlapping right angle cuts (4 in one direction, 4 in another) in a cured resin on a substrate in a pattern that resembles a hash mark (#). A piece of polyester tape with silicone adhesive (3M Polyester Tape 8992, 3M Company St. Paul, Minn.) was laminated over the cut and then rapidly pulled up. A score was given based on the number of squares (defined by the spaces in the hash mark pattern) that remain on the substrate.

- 5—The edges of the cuts were completely smooth with no squares of the lattice detached.
- 4—Small flakes of the coating were detached at intersections. Approximately 5% of the area was affected.
- 3—Flakes of the coating were detached along edges and at intersections of cuts. The area affected was approximately 15% of the lattice.
- 2—The coating flaked along the edges and on parts of the squares. The area affected was 15% to 35% of the lattice.
- 1—The coating flaked along the edges of cuts in large ribbons and whole squares had detached. The area affected was 35% to 65% of the lattice.
- 0—Flaking and detachment was greater than 65% of the lattice.

Test Method 5: Ink Viscosity Measurements 17 mL of each ink formulation was loaded into a 25 mm diameter double gap coaxial concentric cylinder apparatus (DIN 53019) on a viscometer (BOHLIN VISCO 88, Malvern Instruments Ltd, Malvern, UK). A thermal jacket equipped to the double gap cell allowed for the flow of recirculating water heated to 25° C. and 35° C., respectively, and the system was allowed to equilibrate for 1 hour at each temperature prior to taking each measurement. The shear rate was ramped from 100 to 1000 Hz, at 100 Hz intervals, and the measurement was repeated three times. An average across all data points was taken as the viscosity, in centipoise, for all measurements.

Test Method 6: Ink Surface Tension 15 mL of each ink formulation was loaded into a disposable plastic cup and the surface tension was evaluated at ambient temperature using a digital surface tensiometer (Model K10ST, KRÜSS GmbH, Hamburg, Germany) using the du Noüy ring method. This method is described in detail in du Notly, Pierre Lecomte (1925), "An Interfacial Tensiometer for Universal Use". The Journal of General Physiology. 7 (5): 625-633 as well as in ASTM D971-12, "Standard Test Method for Interfacial Tension of Oil Against Water by the Ring Method," (ASTM International, West Conshohocken, Pa., 2012). Correction factors for the measurements were made according to Harkins and Jordan for different density differences at 20° C. (W. D. Harkins and H. F. Jordan, J. Am. Chem. Soc., 52 (1930) 1751).

Test Method 7: Mandrel Bend Test

A cylindrical mandrel bend tester (Elcometer 1506, Elcometer Inc. Rochester Hills, Mich., Part #K1506M201) was used to measure the mechanical flexibility of the films under tension following the procedures outlined in ASTM D522. 2.5 inch by 4.5 inch strips of film were cut with a new razor for each sample. The largest mandrel was placed into the mandrel bend test fixture first and the sample was loaded into the vice so the film faced away from the mandrel and the substrate was in light contact with the mandrel. The bending lever was tightened until it contacted the film, then loosened an eighth of a turn so that there was no pressure between the rollers and the sample. The bending lever was then pulled until it reached the stop position. The sample was then released from the vice and the bending lever was loosened to permit the removal of the sample. The sample was studied for damage using a light table. If no cracks were detected, the next smaller mandrel was selected and the method was repeated until damage was detected. The diameter upon which the film first started to crack was recorded as the overall fail radius in millimeters.

Test Method 8: Percent Solids Measurement

The percentage of volatile components was measured using a Moisture Analyzer (Model #HB43, Mettler Toledo, Greifensee, Switzerland) operated at 80° C. 4-5 g of each ink formulation was dispensed onto a piece of filter paper inside the test chamber. The built-in halogen lamp heated up the sample to the target temperature. The weight of the sample was measured continuously until it reached an equilibrium and the percentage of weight remaining on the filter paper was recorded.

Test Method 9: Inkjet Printing and Drop Analysis

The substrates used were wafers that were coated with 500 nanometers of PECVD-deposited silicon nitride (available from Silicon Valley Microelectronics). The substrates were cleaned by ozone for 10 minutes in a bench-top ozone treater (NovaScan, PSD Pro-Series Digital UV Ozone System, Ames, Iowa).

The formulations were loaded into the inkjet cartridge (10 pL, DIMATIX DMC-11610, available from Fujifilm). The cartridge was loaded into the inkjet printer (FUJIFILM DIMATIX DMP-2850, available from Fujifilm Dimatix Inc., Santa Clara, USA). The ink jet printer was used to make 10 cm by 10 cm squares on the silicon nitride wafer.

To test the stability of the ink over time, the ink was jetted and then the loaded cartridge was allowed to sit for 3 hours and 1 week, respectively, before jetting again. The quality of the inkjetted drops were observed using a high-speed camera running at 15 frames per second and Fujifilm Dimatix "Drop Watcher" software.

Test Method 10: Surface Roughness Measurement

Atomic force microscopy was used to measure the surface roughness of the inkjet printed square patterns. Atomic force microscopy (AFM) was performed on a Veeco Dimension Icon microscope operated in tapping mode under ambient conditions. Olympus OMCL-AC160-TS cantilever tips were used during operation (spring constant=26 N/mi frequency=300 kHz, tip radius <10 nm). Image sizes were 500 nm×100 nm and surface roughness analysis of the height topography was conducted on 3 images for each sample. The average was recorded.

Test Method 11: Gas Chromatography/Mass Spectrometry (GC/MS)

The sample is dissolved in acetone at 1 wt % and 5 μL of this sample was injected into an Agilent 6890 gas chromatograph with mass selective detector under the following conditions: Inlet temperature 250° C. with 75 mL/min hydrogen flow and 50:1 split ratio. Column is HP10-01S-433 "HP-5MS 5% Phenyl methyl siloxane", 30 meters in length with 250 micron diameter. Oven conditions: Initial temperature 75° C. with 1 minute hold, followed by 20° C./minute ramp to 300° C. final oven temperature.

Example Preparation

Synthesis 1: Synthesis of para-thiophenyl benzyl acrylate (PTPBA)

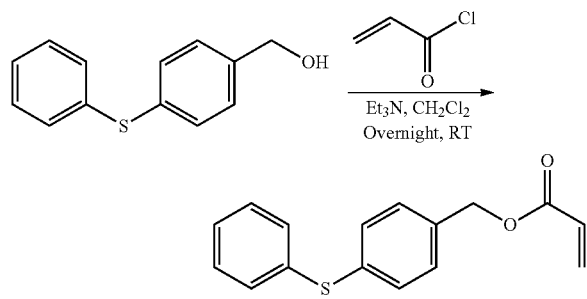

To a 2 L two necked round bottomed flask was added 100 g (0.463 mol) of para-(phenylthio)benzyl alcohol (S1) followed by addition of 350 mL of dichloromethane (DCM). The solution was stirred, and to it was added 77 mL (56 g, 0.5556 mol) of trimethylamine (TEA). The flask was then placed in an ice bath, and the solution was stirred under $N_2$— atmosphere. 56.3 mL (62.7 g, 0.6944 mol) of acryloyl chloride in 100 mL dichloromethane (DCM) was added dropwise to the stirring solution (under ice bath) using an addition funnel, which was connected to a drying tube that contained DRIERITE (W A Hammond Drierite Co., LTD, Xenia, Ohio). After the addition was complete, the solution was warmed to RT, and stirred overnight under $N_2$ atmosphere.

Completion of the reaction was assessed by thin-layer chromatography of the crude reaction using 5:1 S2:S3 as the mobile phase. The flask was placed in an ice bath, and the reaction was quenched using saturated sodium bicarbonate. Most of the DCM was evaporated using rotary evaporation. The crude solution was then taken in S3, and the organic part was extracted using water (2 times) and brine (once). The organic layer was dried over $MgSO_4$, filtered, and the solvent was evaporated to yield the crude product as a brown oil. Wiped film evaporation distillation (conditions 140 deg C. jacket, 22 mTorr vacuum, 10 C condenser low flow) followed by column chromatography (5:1 S2:S3 as the mobile phase) of the crude product gave 76 g of the pure product as a colorless oil. 7 mg of BHT (inhibitor) was added into the final acrylate. $^1H$ NMR (500 MHz, $CDCl_3$): 7.24-7.4 (9H, m), 6.44 (1H, m), 6.15 (1H, m), 5.84 (1H, m), 5.16 (2H, s). The viscosity (measured using Discovery HR-2 hybrid rheometer, TA instrument, New Castle, Del.) at 25° C. was 13 centipoise, and refractive index (measured using Bausch and Lomb Abbe refractometer, Bausch and Lomb, Rochester, N.Y.) was 1.604.

Synthesis 2: Synthesis of 1-napthyl acrylate (1-NA)

200 g of naphthalene-1-ol was dissolved in 1 L of dry tetrahydrofuran. 151 g triethylamine (TEA) and 3.4 g dimethylaminopyridine were added to the solution, and the solution was cooled on an ice bath while stirring. 132 g acryloyl chloride was added slowly while maintaining agitation. The solution was allowed to warm to room temperature overnight. The GC/MS Test Method was used to find when the i-naphthol was consumed. Then the mixture was poured over water and the organic material extracted with S3. Solvent was removed under reduced pressure and the product was purified by thin film distillation to obtain 152 g of product as a clear colorless liquid.

Synthesis 3: Synthesis of 1,3,4-thiadiazole-2,5-diyl)bis(sulfanediyl)bis(ethane-2,1-diyl) diacrylate (TDZDA)

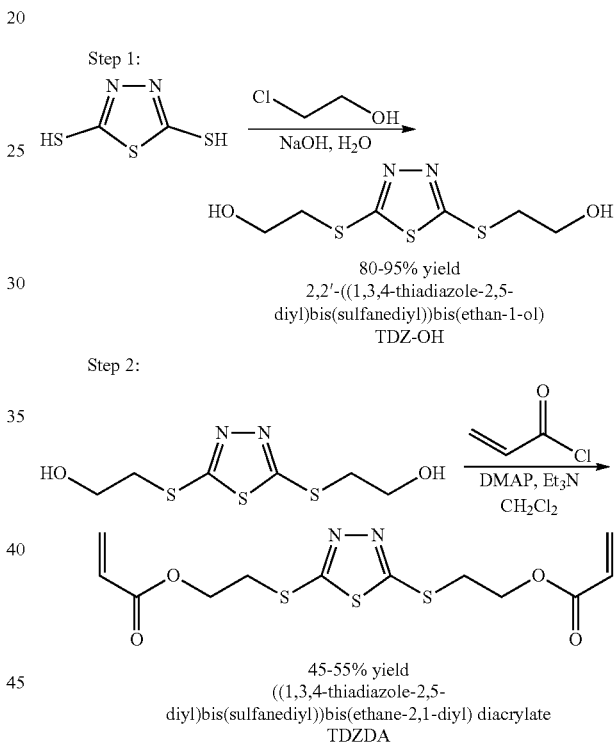

Step 1: Synthesis of 2,2'-((1,3,4-thiadiazole-2,5-diyl)bis(sulfanediyl))bis(ethan-1-ol) (IDZ—OH)

Sodium hydroxide (21.0 g, 525 mmol) was placed in a round bottom flask with a stir bar and dissolved in water (80 mL). 1,3,4-Thiadiazole-2,5-dithiol (38.6 g, 257 mmol) was added slowly and the mixture stirred for 1 hr until the solution became homogeneous. After such time, 2-chloroethanol (40 mL, 600 mmol) was added dropwise. The mixture was heated to 60° C. for 2 hr and then allowed to cool to R1. The product precipitated from solution and was filtered and dried in a vacuum oven (60° C., 1 torr) overnight. A white, crystalline solid was obtained (53.2 g, 87% yield).

Step 2: Synthesis of 1,3,4-thiadiazole-2,5-diyl)bis(sulfanediyl)bis(ethane-2,1-diyl) diacrylate (TDZDA)

Into a flame dried 2-neck flask equipped with a stir bar and addition funnel, was placed TDZ—OH (50.0 g, 210 mmol). Dichloromethane (DCM) (400 mL) was added along with 4-dimethylaminopyridine (2.56 g, 20.7 mmol) and trimethylamine (TEA) (80 mL, 574 mmol). The system was flushed with $N_2$ and a mixture of acryloyl chloride (65 mL, 799 mmol) and dichloromethane (DCM) (100 mL) was added to the addition funnel. The reaction flask was cooled to 0° C. with an ice bath and the acryloyl chloride/$CH_2Cl_2$ mixture was added slowly, dropwise over several hours. The reaction mixture was stirred overnight, warming to RT. After such time, the mixture was cooled to 0° C. and then quenched with methanol (20 mL), followed by a saturated aqueous solution of sodium bicarbonate. The organic layer was separated from the aqueous layer and washed with water, followed by brine, dried ($MgSO_4$), filtered and concentrated. The viscous oil obtained was purified by automated flash chromatography (Biotage Isolera) with S2/S3 and a pale yellow liquid was isolated (41.1 g, 57% yield).

Synthesis 4: Synthesis of 1,3,4-thiadiazole-2,5-diyl)bis(sulfanediyl)bis(ethane-2,1-diyl)bis(2-methylacrylate) (TDZDMA)

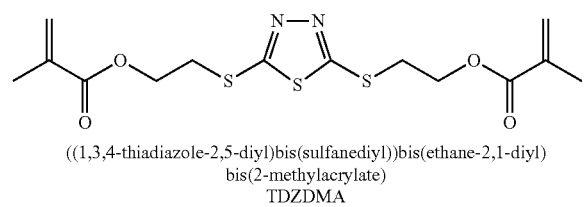 [SMILES: C=C(C)C(=O)OCCSc1nnc(SCCOC(=O)C(=C)C)s1]

((1,3,4-thiadiazole-2,5-diyl)bis(sulfanediyl))bis(ethane-2,1-diyl)
bis(2-methylacrylate)
TDZDMA Into a flame dried 2-neck flask equipped with a stir bar and addition funnel, was placed TDZ—OH (64.0 g, 268.5 mmol). Dichloromethane (DCM) (450 mL) was added along with triethylamine (TEA) (123 mL, 882 mmol). The system was flushed with $N_2$ and methacrylic anhydride (100 mL, 670.1 mmol) was added to the addition funnel. The reaction flask was cooled to 0° C. with an ice bath and the methacrylic anhydride was added slowly, dropwise over several hours. The reaction mixture was stirred overnight, warming to room temperature. After such time, the mixture was cooled to 0° C. and then quenched with a slow addition of water (20 mL). The mixture was transferred to a separatory funnel and the organic layer was separated from the aqueous layer. The aqueous layer was extracted with dichloromethane (DCM) (2×) and the combined organic layers were washed with 10% aqueous NaOH and brine. The organic layer was then dried ($MgSO_4$), filtered and concentrated. The viscous oil obtained was purified by automated flash chromatography (Biotage Isolera) with S2/S3 and a white solid was isolated (54.9 g, 55% yield).

Synthesis 5: Synthesis of 4,4'-bis[(acryloyloxyethylthio)diphenylsulfide] (BADS)

BADS was synthesized according to the method described in You et al., *Journal of Polymer Science: Part A: Polymer Chemistry*, Vol. 48, 2604-2609 (2010).

Formulations:

TABLE 2

Table of Formulations

| Example # | Material (wt. %) | | | | | | | |
|---|---|---|---|---|---|---|---|---|
| | M1 | PTPBA | 1-NA | BADS | TDZDA | TDZDMA | M2 | INK1 |
| E1 | 100 | | | | | | | |
| E2 | 95 | | | 5 | | | | |
| E3 | 95 | | | | 5 | | | |
| E4 | 95 | | | | | | 5 | |
| E5 | | 100 | | | | | | |
| E6 | | 95 | | 5 | | | | |
| E7 | | 75 | | 25 | | | | |
| E8 | | 50 | | 50 | | | | |
| E9 | | | | 100 | | | | |
| E10 | | 80 | | | | 20 | | |
| E11 | | 95 | | | | | 5 | |
| E12 | | | 100 | | | | | |
| E13 | | | 95 | 5 | | | | |
| E14 | | | 95 | | 5 | | | |
| E15 | | | 95 | | | | 5 | |
| CE1 | | | | | | | | 100 |

Examples:

Ink Preparation

Except for CE1, 0.5 wt. % (based on total resin solids) PH1 was added to each of the formulations above and were mixed in an amber vial until homogenous using a sonicating bath. Examples were tested using the Test Methods listed above. Results are shown in Tables 3, 4 and 5 below.

Results

TABLE 3

Measurement of Uncured Ink Properties

| Example # | % Solids | Viscosity (cps) 25° C. | Viscosity (cps) 35° C. | Surface Tension (dyne/cm) | Refractive Index |
|---|---|---|---|---|---|
| E1 | 99.77% | 24.3 | 13.3 | 41.60 | 1.59711 |
| E2 | 99.72% | 30.2 | 18.1 | 38.38 | 1.59795 |
| E3 | 99.66% | 28.2 | 16.9 | 40.48 | 1.59631 |
| E4 | 99.67% | 33.8 | 22.0 | 41.28 | 1.59665 |
| E5 | 99.27% | 15.6 | 10.0 | 37.15 | 1.60243 |
| E6 | 99.17% | 17.2 | 12.4 | 39.41 | 1.60162 |
| E7 | 98.97% | 24.1 | 15.6 | 40.19 | 1.59566 |
| E8 | 99.04% | 32.5 | 24.8 | 41.12 | 1.5902 |
| E9 | 97.58% | 116.6 | 67.1 | 41.82 | 1.57783 |
| E10 | 99.22% | 19.5 | 13.0 | 36.04 | 1.5957 |
| E11 | 99.38% | 18.1 | 11.7 | 38.70 | 1.6022 |
| E12 | 99.70% | 28.0 | 15.7 | 41.67 | 1.60161 |
| E13 | 99.67% | 35.9 | 21.8 | 40.99 | 1.60237 |
| E14 | 99.64% | 32.9 | 17.8 | 41.95 | 1.60056 |
| E15 | 99.65% | 42.3 | 24.6 | 41.92 | 1.60098 |
| CE1 | 72.92% | 19.5 | 12.9 | 26.66 | 1.485003 |

TABLE 4

Measurement of Cured Ink Film Optical Properties

| Example # | Transmission | Haze | Clarity | b* | 633 nm | 532 nm | 404 nm |
|---|---|---|---|---|---|---|---|
| E1 | 89.9 | 0.24 | 99.7 | 1.18 | 1.629 | 1.652 | 1.686 |
| E2 | 89.8 | 0.38 | 99.1 | 1.24 | 1.630 | 1.643 | 1.657 |
| E3 | 89.9 | 0.24 | 98.9 | 1.32 | 1.629 | 1.641 | 1.655 |
| E4 | 89.9 | 0.20 | 99.2 | 1.21 | 1.634 | 1.640 | 1.654 |
| E5 | 89.9 | 0.91 | 95.9 | 1.27 | 1.642 | 1.651 | 1.693 |
| E6 | 89.9 | 0.2 | 99.4 | 1.39 | 1.642 | 1.651 | 1.693 |
| E7 | 97.2 | 75 | 13.4 | 2.75 | 1.642 | 1.651 | 1.693 |
| E8 | 91.5 | 84.7 | 15.5 | 2.86 | 1.642 | 1.651 | 1.693 |
| E9 | 88.6 | 0.36 | 100 | 1.50 | 1.622 | 1.633 | 1.669 |
| E10 | 90.3 | 0.56 | 99.4 | 1.25 | 1.626 | 1.633 | 1.679 |
| E11 | 89.9 | 1.75 | 97.5 | 1.31 | 1.626 | 1.633 | 1.679 |
| E12 | 87.6 | 8.93 | 93.9 | 10.98 | 1.629 | 1.644 | 1.698 |
| E13 | 89.6 | 0.17 | 100 | 5.27 | 1.638 | 1.654 | 1.673 |
| E14 | 90.3 | 0.41 | 99.3 | 10.35 | 1.620 | 1.635 | 1.652 |
| E15 | 89.8 | 0.41 | 98.7 | 8.95 | 1.628 | 1.641 | 1.660 |
| CE1 | 91.3 | 0.14 | 100 | 1.55 | 1.527 | 1.531 | 1.548 |

TABLE 5

Adhesion and Mechanical Properties of Cured Films

| Example # | Peel Test Glass | Peel Test Si₃N₄ | Cross-Hatch Test Glass | Cross-Hatch Test Si₃N₄ | Mandrel Bend Test Fail Radius (mm) |
|---|---|---|---|---|---|
| E1 | 1.00 | 1 | 4.33 | 4 | 20 |
| E2 | 1.00 | 1 | 5.00 | 5 | 20 |
| E3 | 1.00 | 1 | 5.00 | 5 | 25 |
| E4 | 1.00 | 1 | 4.67 | 3 | 4 |
| E5 | 1.00 | 1 | 5.00 | 1 | 2 |
| E6 | 1.00 | 1 | 5.00 | 1 | 2 |
| E7 | 1.00 | 1 | 5.00 | 1 | DNC** |
| E8 | 0.33 | 0 | 3.00 | N/A* | 2 |
| E9 | 1.00 | 1 | 3.00 | 0 | 2 |
| E10 | 1.00 | 1 | 5.00 | 1 | 16 |
| E11 | 1.00 | 1 | 5.00 | 1 | 3 |
| E12 | 0.00 | 0 | N/A | N/A | DNC |
| E13 | 1.00 | 1 | 5.00 | 5 | 19 |
| E14 | 1.00 | 1 | 4.67 | 5 | 2 |
| E15 | 0.33 | 1 | 5.00 | 5 | 20 |
| CE1 | 1.00 | 0 | 0.00 | N/A | 6 |

* = sample was not tested
** = did not crack with any of the available mandrels

Inkjet Printing Results

TABLE 6

| Example Name | time (hr) | Thickness (um) | Rq (nm) | Ra (nm) | Rmax (nm) |
|---|---|---|---|---|---|
| CE1 | 0 | 9.98 | 0.40 | 0.40 | 3.98 |
|  | 3 | — | 0.44 | 0.44 | 4.16 |
| E6 | 0 | 10.5 | 0.20 | 0.20 | 1.92 |
|  | 3 | — | 0.31 | 0.31 | 2.67 |

Visual observation of drops from both the CE1 and E6 formulations at time=0 and time=3 hr confirmed formation of spherical drop shape with no observable satellite drop formation. However, after 1 week sitting at room temperature, the CE1 formulation was no longer able to be inkjetted, while the E6 formulation remained stable.

What is claimed is:
1. A curable ink composition consisting of:
   at least one aromatic (meth)acrylate;
   at least one multifunctional (meth)acrylate with heteroaromatic groups, fused aromatic groups, heteroalkylene groups, or a group containing both heteroalkylene and aromatic groups; and a photoinitiator;
wherein the ink composition is inkjet printable, having a viscosity of 30 centipoise or less at a temperature of from room temperature to 35° C., and is free from solvents, and wherein the ink composition when printed and cured has a refractive index of 1.55 or greater, and is optically clear.

2. The curable ink composition of claim 1, wherein the at least one aromatic (meth)acrylate comprises a monofunctional (meth)acrylate compound of Formula I:

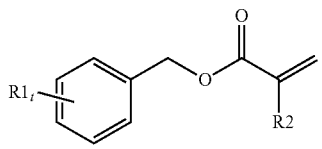

Formula I wherein at least one R1 comprises an aromatic substituent;
t is an integer from 1 to 4; and
R2 is hydrogen or methyl.

3. The curable ink composition of claim 2, wherein the monofunctional (meth)acrylate compound comprises at least one aromatic substituent R1 comprising:
a substituted or unsubstituted aromatic group of the type —CH₂—Ar; or
a heteroatom linked aromatic group of the type —X—Ar, where X is S or O, and wherein each Ar is independently a substituted or unsubstituted phenyl group, a fused aromatic group, or 2 or more alkyl group-linked phenyl or substituted phenyl or substituted phenyl groups.

4. The curable ink composition of claim 3, wherein the at least one R1 group comprises:

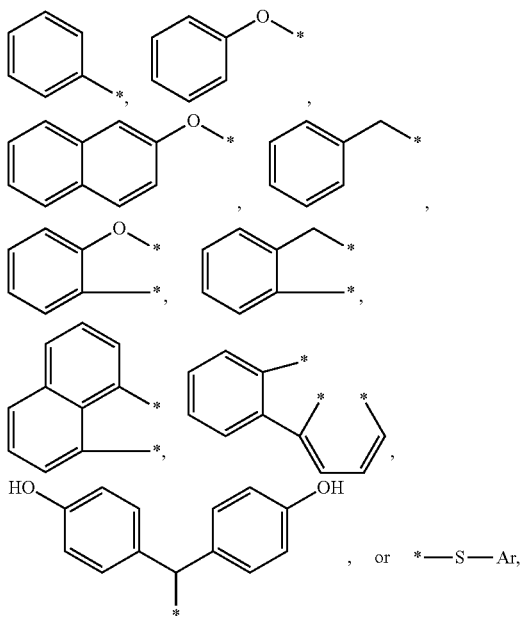

where each * denotes the point(s) of attachment to the aromatic ring of Formula I; and
Ar is a substituted or unsubstituted phenyl group, a fused aromatic group, or 2 or more alkyl group-linked phenyl or substituted phenyl or substituted phenyl groups.

5. The curable ink composition of claim 1, wherein the at least one aromatic (meth)acrylate comprises a compound of Formula IA:

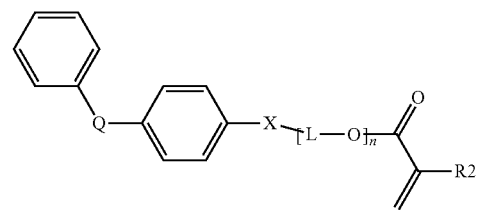

Formula IA wherein R2 is H or CH₃;
X is O, S, or a single bond;
Q is O, S, SiR₂ where R is an alkyl group, a carbonyl group (C═O), an amino group NR where R is hydrogen or an alkyl, or an SO₂ group;
n is an integer ranging from 0 to 10; and
L is an alkylene group having 1 to 5 carbon atoms, optionally substituted with hydroxyl groups.

6. The curable ink composition of claim 5, wherein
R2 is a hydrogen;
n is zero;
X is an oxygen; and
Q is a sulfur.

7. The curable ink composition of claim 1, wherein the at least one aromatic (meth)acrylate has a refractive index of at least 1.50.

8. The curable ink composition of claim 1, wherein the at least one multifunctional (meth)acrylate comprises a compound of Formula II:

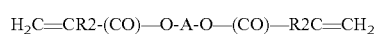

$$H_2C=CR2-(CO)-O-A-O-(CO)-R2C=CH_2$$ Formula II wherein R2 is hydrogen or methyl;
(CO) is a carbonyl group C═O; and
A is divalent group comprising a heteroaromatic group, a fused aromatic group, a heteroalkylene group, or a group containing both heteroalkylene and aromatic groups.

9. The curable ink composition of claim 8, wherein the at least one multifunctional (meth)acrylate comprises a compound of Formula IIA:

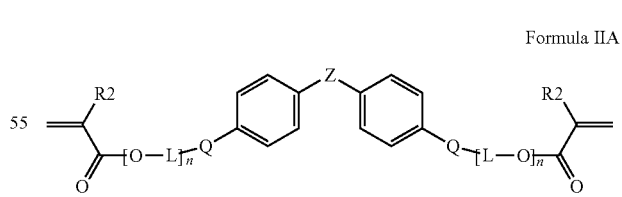

Formula IIA wherein each R2 is independently hydrogen or methyl;
Z is —C(CH₃)₂—, —CH₂—, O, S, or a single bond;
each Q is independently O or S;
L is an alkylene group comprising 2-12 carbon atoms; and
n is an integer ranging from 0 to 10.

10. The curable ink composition of claim 9 wherein the at least one multifunctional (meth)acrylate comprises:

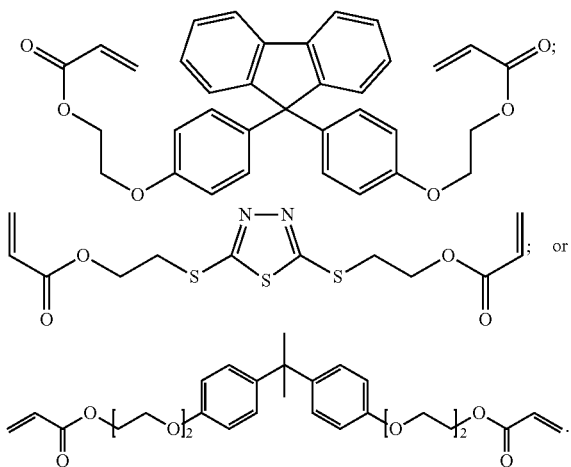

11. The curable ink composition of claim 1, wherein the ink composition comprises greater than 50% by weight of aromatic (meth)acrylate.

12. An article comprising:
a substrate with a first major surface and a second major surface;
a cured organic layer adjacent to at least a portion of the second major surface of the substrate, wherein the cured organic layer comprises a crosslinked (meth)acrylate-based layer, and has a refractive index of 1.55 or greater, and is optically clear; and
an inorganic barrier layer in contact with the cured organic layer, wherein the cured organic layer comprises a curable ink composition that has been printed and cured on at least a portion of the second major surface of the substrate, wherein the curable ink composition consists of:
at least one aromatic (meth)acrylate;
at least one multifunctional (meth)acrylate with heteroaromatic groups, fused aromatic groups, heteroalkylene groups, or a group containing both heteroalkylene and aromatic groups; and
a photoinitiator; and
wherein the curable ink composition is inkjet printable has a viscosity of 30 centipoise or less at a temperature of from room temperature to 35° C., and is free from solvents.

13. The article of claim 12, wherein the cured organic layer has a thickness of from 1 to 16 micrometers, and a surface roughness of less than or equal to 5 nanometers.

14. The article of claim 12, wherein the article further comprises a device disposed on the second major surface of the substrate, and adjacent to the cured organic layer.

15. The article of claim 14, wherein the device comprises an OLED (organic light-emitting diode).

16. A method of preparing an article comprising:
providing a substrate with a first major surface and a second major surface;
providing a curable ink composition wherein the curable ink composition consists of:
at least one monofunctional aromatic (meth)acrylate;
at least one multifunctional (meth)acrylate with heteroaromatic groups, fused aromatic groups, heteroalkylene groups, or a group containing both heteroalkylene and aromatic groups; and
a photoinitiator; and
wherein the curable ink composition is free from solvents, and wherein the ink composition when inkjet printed and cured has a refractive index of 1.55 or greater, and is optically clear;
disposing the curable ink composition on at least a portion of the second major surface of the substrate to form a curable layer;
curing the curable layer to form a cured organic layer; and
depositing an inorganic barrier layer on the cured organic layer.

17. The method of claim 16, wherein disposing of the curable ink composition on the second major surface of the substrate to form a curable layer comprises inkjet printing to a thickness of from 1 to 16 micrometers.

18. The method of claim 17, wherein cured organic layer has a surface roughness that is less than 5 nanometers.

19. The method of claim 16, further comprising providing a device; and
disposing the device on the second major surface of the substrate prior to disposing the curable ink composition on the second major surface of the substrate to form a curable layer.

* * * * *

UNITED STATES PATENT AND TRADEMARK OFFICE
CERTIFICATE OF CORRECTION

PATENT NO. : 11,584,863 B2
APPLICATION NO. : 16/473841
DATED : February 21, 2023
INVENTOR(S) : Evan L Schwartz Page 1 of 1

It is certified that error appears in the above-identified patent and that said Letters Patent is hereby corrected as shown below:

In the Claims

Column 35
Line 63 (approx.), In Claim 4, insert --*-- after "where each".

Signed and Sealed this
Fourteenth Day of November, 2023

Katherine Kelly Vidal
*Director of the United States Patent and Trademark Office*